(12) United States Patent
Umezaki

(10) Patent No.: US 10,885,860 B2
(45) Date of Patent: Jan. 5, 2021

(54) DISPLAY DEVICE AND ELECTRONIC DEVICE

(71) Applicant: Semiconductor Energy Laboratory Co., Ltd., Atsugi (JP)

(72) Inventor: Atsushi Umezaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/817,860

(22) Filed: Mar. 13, 2020

(65) Prior Publication Data

US 2020/0219457 A1 Jul. 9, 2020

Related U.S. Application Data

(63) Continuation of application No. 15/700,825, filed on Sep. 11, 2017, now Pat. No. 10,593,274, which is a (Continued)

(30) Foreign Application Priority Data

Jun. 25, 2009 (JP) .................................. 2009-150617

(51) Int. Cl.
*G09G 3/30* (2006.01)
*G09G 3/36* (2006.01)
(Continued)

(52) U.S. Cl.
CPC ............. *G09G 3/3648* (2013.01); *G09G 3/20* (2013.01); *G09G 3/3677* (2013.01);
(Continued)

(58) Field of Classification Search
CPC ... G09G 3/36–38; G09G 3/3611–3696; G09G 3/3266; G09G 2310/02–0229
See application file for complete search history.

(56) References Cited

U.S. PATENT DOCUMENTS 5,986,630 A 11/1999 Hirakata et al.
6,967,639 B2 11/2005 Kanzaki et al.
(Continued)

FOREIGN PATENT DOCUMENTS

CN 101135791 A 3/2008
CN 101261881 A 9/2008
(Continued)

OTHER PUBLICATIONS

Taiwanese Office Action (Application No. 108127250) dated Apr. 7, 2020.
(Continued)

*Primary Examiner* — Sanghyuk Park
(74) *Attorney, Agent, or Firm* — Fish & Richardson P.C.

(57) ABSTRACT

It is an object to provide a display device which can favorably display a image without delayed or distorted signals. The display device includes a first gate driver and a second gate driver. The first gate driver and the second gate driver each include a plurality of flip flop circuits and a plurality of transfer signal generation circuits. Both the flip flop circuit and the transfer signal generation circuit are circuits which output a signal inputted to a first input terminal with a half clock cycle delay. In addition, an output terminal of the transfer signal generation circuit is directly connected to a first input terminal of the flip flop circuit in the next stage. Therefore, delay and distortion of the signal which is inputted from the transfer signal generation circuit to the flip flop circuit can be reduced.

6 Claims, 15 Drawing Sheets

Related U.S. Application Data continuation of application No. 14/670,531, filed on Mar. 27, 2015, now Pat. No. 9,761,190, which is a continuation of application No. 12/794,939, filed on Jun. 7, 2010, now Pat. No. 8,994,636.

(51) Int. Cl.
*G09G 3/20* (2006.01)
*H03K 17/04* (2006.01)

(52) U.S. Cl.
CPC .......... *G09G 2300/0426* (2013.01); *G09G 2310/0267* (2013.01); *G09G 2310/0286* (2013.01); *G09G 2320/043* (2013.01); *G09G 2352/00* (2013.01); *H03K 17/04* (2013.01)

(56) References Cited

U.S. PATENT DOCUMENTS

| | | |
|---|---|---|
| 7,173,676 B2 | 2/2007 | Jeon et al. |
| 7,283,111 B2 | 10/2007 | Kimura |
| 7,332,742 B2 | 2/2008 | Miyake et al. |
| 7,522,145 B2 | 4/2009 | Lee et al. |
| 7,548,228 B2 | 6/2009 | Pak et al. |
| 7,573,445 B2 | 8/2009 | Machida |
| 7,656,004 B2 | 2/2010 | Jeon et al. |
| 7,738,623 B2 | 6/2010 | Tobita |
| 7,825,888 B2 | 11/2010 | Tobita et al. |
| 8,531,376 B2 | 9/2013 | Shimoda |
| 8,605,027 B2 | 12/2013 | Pak et al. |
| 8,994,636 B2 | 3/2015 | Umezaki |
| 9,099,036 B2 | 8/2015 | Kitazawa |
| 9,761,190 B2 | 9/2017 | Umezaki |
| 10,593,274 B2 | 3/2020 | Umezaki |
| 2004/0217935 A1 | 11/2004 | Jeon et al. |
| 2005/0285840 A1 | 12/2005 | Jang et al. |
| 2006/0001637 A1 | 1/2006 | Pak et al. |
| 2006/0139293 A1 | 6/2006 | Cho |
| 2006/0145998 A1 | 7/2006 | Cho et al. |
| 2006/0156118 A1 | 7/2006 | Shin |
| 2006/0221040 A1 | 10/2006 | Pak et al. |
| 2006/0227093 A1 | 10/2006 | Jang et al. |
| 2007/0001953 A1 | 1/2007 | Jang et al. |
| 2007/0070020 A1 | 3/2007 | Edo et al. |
| 2007/0103404 A1 | 5/2007 | Shin |
| 2007/0151144 A1 | 7/2007 | Hou et al. |
| 2007/0216634 A1 | 9/2007 | Kim et al. |
| 2008/0062112 A1 | 3/2008 | Umezaki |
| 2008/0100560 A1 | 5/2008 | Na et al. |
| 2008/0174580 A1 | 7/2008 | Chang et al. |
| 2008/0192032 A1 | 8/2008 | Park et al. |
| 2008/0218502 A1 | 9/2008 | Lee et al. |
| 2008/0219401 A1 | 9/2008 | Tobita |
| 2008/0258998 A1 | 10/2008 | Miyake |
| 2008/0266234 A1 | 10/2008 | Ieong et al. |
| 2009/0021466 A1* | 1/2009 | Otose .................. G09G 3/3674 345/100 |

FOREIGN PATENT DOCUMENTS

| | | |
|---|---|---|
| EP | 1895545 A | 3/2008 |
| EP | 1942176 A | 7/2008 |
| JP | 58-045034 B | 10/1983 |
| JP | 02-253232 A | 10/1990 |
| JP | 2000-347628 A | 12/2000 |
| JP | 2003-173167 A | 6/2003 |
| JP | 2004-334216 A | 11/2004 |
| JP | 2005-251348 A | 9/2005 |
| JP | 2006-024350 A | 1/2006 |
| JP | 2006-285233 A | 10/2006 |
| JP | 2006-351165 A | 12/2006 |
| JP | 2007-257812 A | 10/2007 |
| JP | 2008-083692 A | 4/2008 |
| JP | 2008-112550 A | 5/2008 |
| JP | 2008-176269 A | 7/2008 |
| JP | 2008-217902 A | 9/2008 |
| JP | 2008-251061 A | 10/2008 |
| JP | 4163416 | 10/2008 |
| JP | 6541907 | 7/2019 |
| KR | 2005-0001790 A | 1/2005 |
| KR | 2008-0021557 A | 3/2008 |
| KR | 2008-0081822 A | 9/2008 |
| KR | 10-1945676 | 2/2019 |
| TW | 200506800 | 2/2005 |
| TW | 200816144 | 4/2008 |
| WO | WO-2004/104981 | 12/2004 |
| WO | WO-2010/150607 | 12/2010 |

OTHER PUBLICATIONS

International Search Report (Application No. PCT/JP2010/058687) dated Aug. 24, 2010.

Written Opinion (Application No. PCT/JP2010/058687) dated Aug. 24, 2010.

Taiwanese Office Action (Application No. 104118301) dated Apr. 13, 2016.

Korean Office Action (Application No. 2011-7030743) dated Apr. 18, 2016.

* cited by examiner

DISPLAY DEVICE AND ELECTRONIC DEVICE

CROSS-REFERENCE TO RELATED APPLICATIONS

This application is a continuation of U.S. application Ser. No. 15/700,825, filed Sep. 11, 2017, now allowed, which is a continuation of U.S. application Ser. No. 14/670,531, filed Mar. 27, 2015, now U.S. Pat. No. 9,761,190, which is a continuation of U.S. application Ser. No. 12/794,939, filed Jun. 7, 2010, now U.S. Pat. No. 8,994,636, which claims the benefit of a foreign priority application filed in Japan as Serial No. 2009-150617 on Jun. 25, 2009, all of which are incorporated by reference.

TECHNICAL FIELD

An embodiment of the present invention relates to a display device driven by an active matrix mode and an electronic device including the display device.

BACKGROUND ART

A display device driven by an active matrix mode includes an element such as a transistor which functions as a switch in a pixel, a driving circuit (a source driver) which is electrically connected to the pixel and outputs an image signal to the pixel when the switch is on, and a driving circuit (a gate driver) which controls switching of the switch.

Further, a transistor not only can function as a switch in pixels but also can form a gate driver. Therefore, a display device including the switches in the pixels and the gate driver which are formed using the transistors formed using a non-single-crystal semiconductor provided over an insulating substrate is developed.

The above gate driver is provided close to a pixel portion of the display device. However, the gate driver provided close to one side of the pixel portion results in a display portion being closer to one side than to the other. Thus, a display device which has gate drivers, which are formed by dividing a gate driver, placed in both right side and left side of the pixel portion is developed (for example, see Patent Document 1).

FIG. 10 illustrates the structure of the display device disclosed in Patent Document 1. In the display device illustrated in FIG. 10, a first gate driver 1002A and a second gate driver 1002B are provided so as to face each other with a pixel portion 1001 sandwiched therebetween. An output terminal of the first gate driver 1002A is electrically connected to an odd-numbered gate line. An output terminal of the first gate driver 1002B is electrically connected to an even-numbered gate line. That is, the first gate driver 1002A controls an electrical connection between a source driver and a pixel which is placed in an odd-numbered line in the pixel portion 1001, while the second gate driver 1002B controls an electrical connection between the source driver and a pixel which is placed in an even-numbered line in the pixel portion 1001.

Further, the first gate driver 1002A and the second gate driver 1002B each include a plurality of shift registers. An output terminal of the first shift register (SRC$_1$) is electrically connected to one of input terminals of a second shift register (SRC$_2$) through a first gate line 1003$_1$. An output terminal of the second shift register (SRC$_2$) is electrically connected to one of input terminals of a third shift register (SRC$_3$) through a second gate line 1003$_2$. In a similar manner, an output terminal of a k-th shift register (SRC$_k$) is electrically connected to one of input terminals of a (k+1)th shift register (SRC$_{k+1}$) through a k-th gate line 1003$_k$. That is, a signal for an electrical connection between a source driver and a pixel provided in one line is used as a start pulse signal of a shift register an output terminal of which is connected to a pixel provided in the next line.

REFERENCE

[Patent Document 1] Japanese Patent No. 4163416

DISCLOSURE OF INVENTION

A gate line extending in the pixel portion has various parasitic capacitance and parasitic resistance. In particular, an influence of parasitic capacitances and parasitic resistances which are hold by the gate line become large as the pixel portion becomes high-quality. As described above, in the display device illustrated in FIG. 10, a start pulse signal of a shift register is inputted through a gate line. Therefore, it can be said that in the display device illustrated in FIG. 10, a signal will be highly likely to be delayed or distorted signal by increase in definition and size.

In view of the above-described problem, it is an object of an embodiment of the present invention to provide a display device which is capable of favorably displaying an image.

Further, it is an object of an embodiment of the present invention to provide a display device whose gate driver is formed using a unipolar transistor.

Furthermore, it is an object of an embodiment of the present invention to provide a display device including a gate driver whose circuit area is reduced.

An embodiment of the present invention is a display device. The display device includes a plurality of gate lines provided so as to be parallel or approximately parallel to each other, a first gate driver which is electrically connected to each gate line in odd-numbered rows, and a second gate driver which is electrically connected to each gate line in even-numbered rows. The first gate driver includes a k-th flip flop circuit and a k-th transfer signal generation circuit (k is an odd number equal to or lager than 3). In the k-th flip flop circuit, an output terminal is electrically connected to a k-th gate line, a first input terminal is electrically connected to an output terminal of a (k−2)th transfer signal generation circuit, a second input terminal is electrically connected to a clock signal line, and a third input terminal is electrically connected to a stop pulse signal line for the k-th flip flop circuit. In the k-th transfer signal generation circuit, an output terminal is electrically connected to a first input terminal of a (k+2)th flip flop circuit, a first input terminal is electrically connected to the output terminal of the k-th flip flop circuit, a second input terminal is electrically connected to an inverted clock signal line, and a third input terminal is electrically connected to a stop pulse signal line for the k-th transfer signal generation circuit. The second gate driver includes a (k+1)th flip flop circuit and a (k+1)th transfer signal generation circuit. In the (k+1)th flip flop circuit, an output terminal is electrically connected to a (k+1)th gate line, a first input terminal is electrically connected to an output terminal of a (k−1)th transfer signal generation circuit, a second input terminal is electrically connected to the inverted clock signal line, and a third input terminal is electrically connected to a stop pulse signal line for the (k+1)th flip flop circuit. In the (k+1)th transfer signal generation circuit, an output terminal is electrically connected to a first input terminal of a (k+3)th flip flop circuit, a first input terminal is electrically connected to the output terminal of the (k+1)th flip flop circuit, a second input terminal is electrically connected to the clock signal line, and a third input terminal is electrically connected to a stop pulse signal line for the k-th transfer signal generation circuit.

Further, a display device in which a structure of the k-th flip flop circuit is the same as a structure of the k-th transfer signal generation circuit is also an embodiment of the present invention.

Note that the above stop pulse signal line is a wiring which inputs a stop pulse signal to each circuit.

Specifically, an output signal of the k-th transfer signal generation circuit can be used as a stop pulse signal for the k-th flip flop circuit.

Alternatively, an output signal of the (k+1)th flip flop circuit can be used as a stop pulse signal for the k-th flip flop circuit.

Similarly, an output signal of the (k+2)th flip flop circuit can be used as a stop pulse signal for the k-th transfer signal generation circuit.

Alternatively, an output signal of the (k+1)th transfer signal generation circuit can be used as a stop pulse signal for the k-th transfer signal generation circuit.

In addition, an electronic device including a display device having the above structure is also an embodiment of the present invention.

A first gate driver and a second gate driver provided in a display device of an embodiment of the present invention include a transfer signal generation circuit which makes an inputted signal be outputted with a half clock cycle delay. Therefore, a display device which can favorably display an image without delayed or distorted signals can be provided.

BEST MODE FOR CARRYING OUT THE INVENTION

Hereinafter, embodiments and an example of the present invention will be described in detail with reference to the accompanying drawings. Note that the present invention is not limited to the description below, and it will be easily understood by those skilled in the art that a variety of changes and modifications can be made without departing from the spirit and scope of the present invention. Therefore, the present invention should not be construed as being limited to the descriptions of the embodiments and the example below.

Embodiment 1

Embodiment 1 describes an example of a display device which is an embodiment of the present invention. Specifically, an active-matrix display device including a first gate driver and a second gate driver is described with reference to FIG. 1, FIG. 2, and FIG. 3.

[An Example of a Structure of a Display Device]

Figure 1:
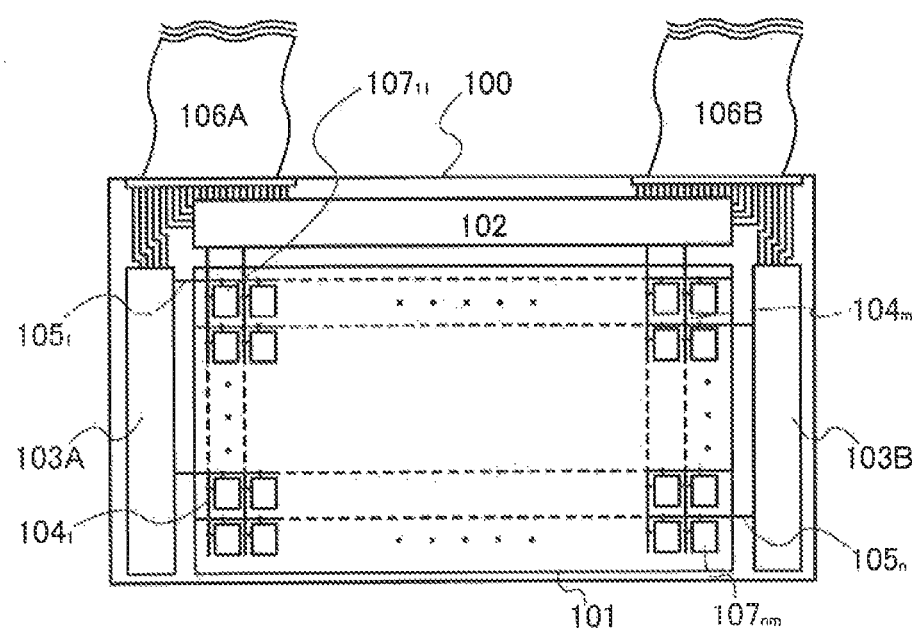
FIG. 1 illustrates a display device described in Embodiment 1.

FIG. 1 illustrates an active-matrix display device 100. The display device 100 includes a pixel portion 101, a source driver 102, a first gate driver 103A, a second gate driver 103B, m (m is a positive integer) source lines $104_1$ to $104_m$ which are provided so as to be parallel or approximately parallel to each other, and n (n is a positive integer) gate lines $105_1$ to $105_n$ which are provided so as to be parallel or approximately parallel to each other. Note that a pixel portion 101 is provided in a central part of the display device 100. The source driver 102 is provided close to a side of the pixel portion 101. The first gate driver 103A and the second gate driver 103B are provided close to other sides of the pixel portion 101 and are provided so as to face each other with the pixel portion 101 therebetween. Further, the source driver 102 is electrically connected to the pixel portion 101 through the m source lines $104_1$ to $104_m$. The first gate driver 103A is electrically connected to the pixel portion 101 through odd-numbered source lines among the n gate lines $105_1$ to $105_m$. The second gate driver 103B is electrically connected to the pixel portion 101 through even-numbered source lines among the n gate lines $105_1$ to $105_n$.

In addition, a signal (a clock signal, a start pulse signal, or the like) is inputted from the outside to the source driver 102, the first gate driver 103A, and the second gate driver 103B through flexible printed circuits 106A and 106B.

Further, the pixel portion 101 includes n×m pixels $107_{11}$ to $107_{nm}$. Note that the pixels $107_{11}$ to $107_{nm}$ are arranged in n rows and m columns. In addition, each of the m source lines $104_1$ to $104_m$ is electrically connected to n pixels which are arranged in the same row. In other words, the pixel $105_{ij}$ which is arranged in the i row and the j column (i and j are positive integers) (1≤i≤n and 1≤j≤m) is electrically connected to the source line $104_j$ and gate line $105_i$.

That is, the source driver 102 is electrically connected to each pixel included in the pixel portion 101 through the m source lines $104_1$ to $104_m$. The first gate driver 103A is electrically connected to each pixel arranged in odd-numbered rows in the pixel portion 101 through odd-numbered gate lines among the n gate lines $105_1$ to $105_n$. The second gate driver 103B is electrically connected to each pixel arranged in even-numbered rows in the pixel portion 101 through even-numbered gate lines among the n gate lines $105_1$ to $105_n$.

[An Operation Example of the Display Device]

In the display device 100, the source driver 102 is a circuit which outputs an image signal to the pixels $107_{11}$ to $107_{nm}$ included in the pixel portion 101. The first gate driver 103A and the second gate driver 103B are circuits which control electrical continuity between the source driver 102 and the pixels $107_{11}$ to $107_{nm}$.

The display device 100 displays an image in the pixel portion 101 by an image signal inputted to the n×m pixels $107_{11}$ to $107_{nm}$. A specific operation of the display device 100 is described below.

First, the first gate driver 103A selects m pixels arranged in a first row (the source driver 102 and the m pixels arranged in the first row are electrically connected); then, an image signal is inputted to the m pixels $107_{11}$ to $107_{1m}$ arranged in the first row through the source lines $104_1$ to $104_m$. Next, the second gate driver 103B selects m pixels arranged in a second row; then, an image signal is inputted to the m pixels $107_{21}$ to $107_{2m}$ arranged in the second row through the source lines $104_1$ to $104_m$. After that, the first gate driver 103A and the second gate driver 103B alternately select m pixels in each row as in a similar manner. The display device 100 displays an image by the above operation subsequently performed.

[A Structural Example of the Gate Driver]

Figure 2:
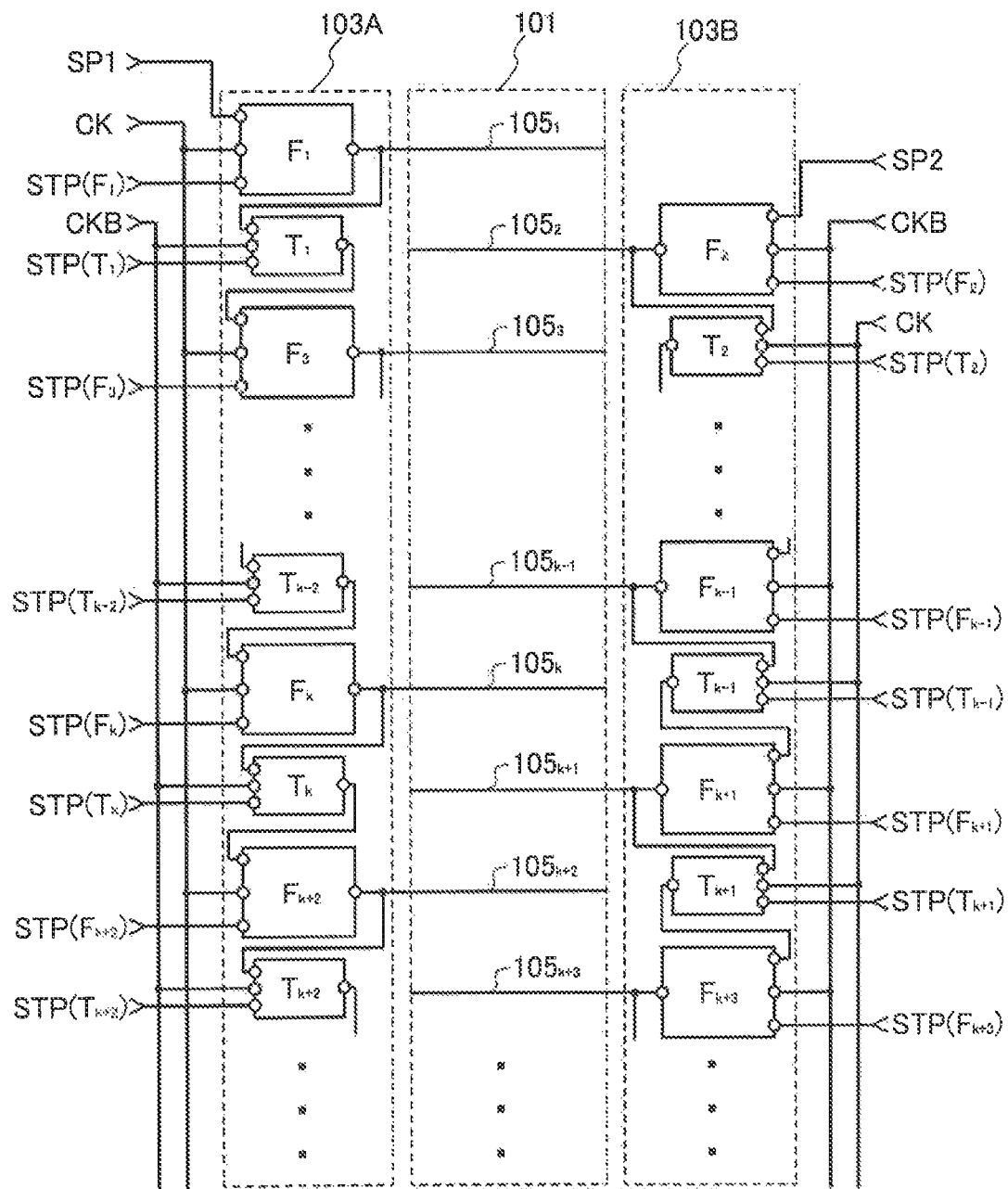
FIG. 2 illustrates a structure of a gate driver described in Embodiment 1.

FIG. 2 is a block diagram illustrating a detailed structural example of the first gate driver 103A and the second gate driver 103B included in the active-matrix display device 100.

The first gate driver 103A and the second gate driver 103B each include a plurality of flip flop circuits and a plurality of transfer signal generation circuits which have at least three input terminals and one output terminal.

In a first flip flop circuit ($F_1$) included in the first gate driver 103A, an output terminal is electrically connected to the first gate line $105_1$, a first input terminal is electrically connected to a first start pulse signal (SP1) line, a second input terminal is electrically connected to a clock signal (CK) line, and a third input terminal is electrically connected to a stop pulse signal (STP($F_1$)) line for the first flip flop circuit.

Further, in a first transfer signal generation circuit ($T_1$) included in the first gate driver 103A, an output terminal is electrically connected to a first input terminal of a third flip flop circuit ($F_3$), a first input terminal is electrically connected to the output terminal of the first flip flop circuit ($F_1$), a second input terminal is electrically connected to an inverted clock signal (CKB) line, and a third input terminal is electrically connected to a stop pulse signal (STP($T_1$)) line for the first transfer signal generation circuit.

In a second flip flop circuit ($F_2$) included in the second gate driver 103B, an output terminal is electrically connected to the second gate line $105_2$, a first input terminal is electrically connected to a second start pulse signal (SP2) line, a second input terminal is electrically connected to the inverted clock signal (CKB) line, and a third input terminal is electrically connected to a stop pulse signal (STP($F_2$)) line for the second flip flop circuit.

Further, in a second transfer signal generation circuit ($T_2$) included in the second gate driver 103B, an output terminal is electrically connected to a first input terminal of a fourth flip flop circuit (not shown), a first input terminal is electrically connected to the output terminal of the second flip flop circuit ($F_2$), a second input terminal is electrically connected to the clock signal (CK) line, and a third input terminal is electrically connected to the stop pulse signal (STP($T_2$)) line for the second transfer signal generation circuit.

In a k-th (k is an odd number equal to or larger than three) flip flop circuit ($F_k$) included in the first gate driver 103A, an output terminal is electrically connected to a k-th gate line $105_k$, a first input terminal is electrically connected to an output terminal of a (k−2)th transfer signal generation circuit ($T_{k-2}$), a second input terminal is electrically connected to the clock signal (CK) line, and a third input terminal is electrically connected to a stop pulse signal (STP($F_k$)) line for a k-th flip flop circuit.

Further, in a k-th transfer signal generation circuit ($T_k$) included in the first gate driver 103A, an output terminal is electrically connected to a (k+2)th flip flop circuit ($F_{k+2}$), a first input terminal is electrically connected to the output terminal of the k-th flip flop circuit ($F_k$), a second input terminal is electrically connected to the inverted clock signal (CKB) line, and a third input terminal is electrically connected to a stop pulse signal (STP($T_k$)) line for a k-th transfer signal generation circuit.

In a (k+1)th flip flop circuit ($F_{k+1}$) included in the second gate driver 103B, an output terminal is electrically connected to a (k+1)th gate line $105_{k+1}$, a first input terminal is electrically connected to an output terminal of a (k−1)th transfer signal generation circuit ($T_{k-1}$), a second input terminal is electrically connected to the inverted clock signal (CKB) line, and a third input terminal is electrically connected to a stop pulse signal (STP($F_{k+1}$)) line for a (k+1)th flip flop circuit.

Further, in a (k+1)th transfer signal generation circuit ($T_{k+1}$) included in the second gate driver 103B, an output terminal is electrically connected to a (k+3)th flip flop circuit ($F_{k+3}$), a first input terminal is electrically connected to an output terminal of the (k+1)th flip flop circuit ($F_{k+1}$), a second input terminal is electrically connected to the clock signal (CK) line, and a third input terminal is electrically connected to a stop pulse signal (STP($T_{k+1}$)) line for a (k+1)th transfer signal generation circuit.

The above plurality of flip flop circuits and plurality of transfer signal generation circuits included in the first gate driver 103A and the above plurality of flip flop circuits and plurality of transfer signal generation circuits included in the second gate driver 103B have similarities and differences in an electrical connection relationship. A specific difference is described below.

First, a difference in an electrical connection relationship between the flip flop circuit and the transfer signal generation circuit included in the first gate driver, and the flip flop circuit and the transfer signal generation circuit included in the second gate driver is described below.

In the first gate driver 103A, a second input terminal of a flip flop circuit is electrically connected to the clock signal (CK) line, and a second input terminal of a transfer signal generation circuit is electrically connected to the inverted clock signal (CKB) line. On the other hand, in the second gate driver 103B, a second input terminal of a flip flop circuit is electrically connected to the inverted clock signal (CKB) line, and a second input terminal of a transfer signal generation circuit is electrically connected to the clock signal (CK) line.

Next, the difference in an electrical connection relationship of the flip flop circuit and the transfer signal generation circuit is described below.

As the output terminal of the first flip flop circuit ($F_1$) is connected to the first gate line $105_1$, an output terminal of a flip flop circuit is electrically connected to a gate line which is provided in the same row. On the other hand, as the output terminal of the first transfer signal generation circuit ($T_1$) is electrically connected to the first input terminal of the third flip flop circuit ($F_3$), an output terminal of a transfer signal generation circuit is electrically connected to a first input terminal of a flip flop circuit provided in the next stage. Note that first input terminals of the first flip flop circuit ($F_1$) and the second flip flop circuit ($F_2$), which do not have transfer signal circuits in the previous stages, are electrically connected to the first start pulse signal (SP1) line and the second start pulse signal (SP2) line, respectively.

In addition, each of third input terminals of all the flip flop circuits and all the transfer signal generation circuits is electrically connected to corresponding stop pulse signal (STP) lines.

[An Example of Operation of the Gate Driver]

Figure 3:
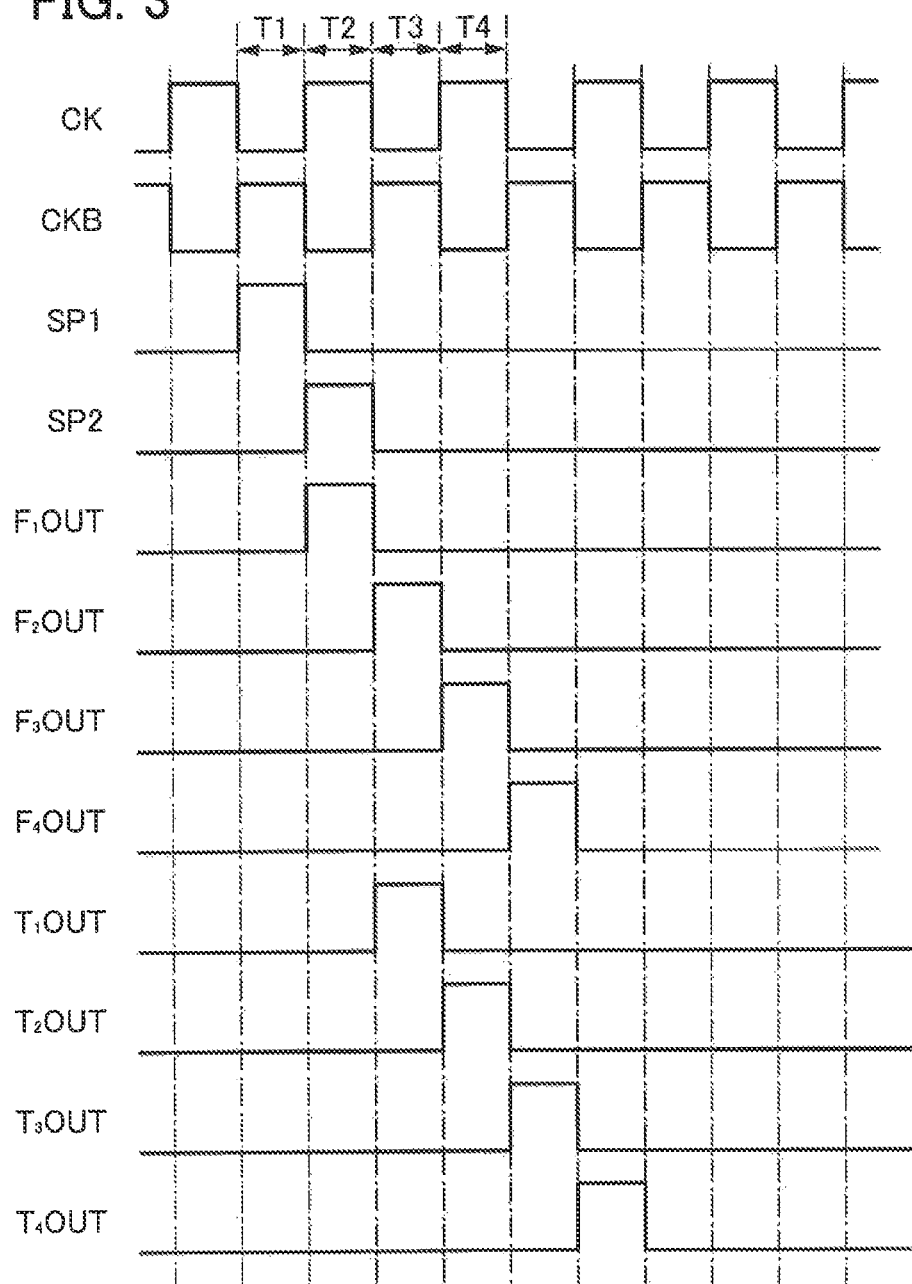
FIG. 3 illustrates a timing chart of a gate driver described in Embodiment 1.

FIG. 3 is a timing chart. Note that, in FIG. 3, a clock signal (CK), an inverted clock signal (CKB), a first start pulse signal (SP1), a second start pulse signal (SP2), an output signal of the first flip flop circuit ($F_1$OUT) to an output signal of the fourth flip flop circuit ($F_4$OUT), and an output signal of the first transfer signal generation circuit ($T_1$OUT) to an output signal of the fourth transfer signal generation circuit ($T_4$OUT) are illustrated. Note that a clock signal (CK) is a signal which oscillates between a high (hereinafter, referred to as H) level and a low (hereinafter, referred to as L) level at a constant frequency. An inverted clock signal (CKB) is a signal whose level is inverted from the level of the clock signal.

In a period T1, the first start pulse signal (SP1) goes to an H level, and an H level signal is inputted to the first input terminal of the first flip flop circuit ($F_1$).

In a period T2, a second start pulse signal (SP2) goes to the H level, and an H level signal is inputted to the first input terminal of the second flip flop circuit ($F_2$). In addition, an H level signal is outputted from the first flip flop circuit ($F_1$). Note that an H level signal which is outputted from the first flip flop circuit ($F_1$) is inputted through the first gate line $105_1$ to each of the pixels $107_{11}$ to $107_{1m}$ arranged in the first row in the pixel portion 101. Accordingly, each of the pixels $107_{11}$ to $107_{1m}$ arranged in the first row and the source driver 102 are electrically connected, so that an image signal is inputted from the source driver 102 to each of the pixels $107_{11}$ to $107_{1m}$ arranged in the first row. Further, an H level signal outputted from the first flip flop circuit ($F_1$) is inputted to the first input terminal of the first transfer signal generation circuit ($T_1$).

In a period T3, an H level signal is outputted from the second flip flop circuit ($F_2$). As when the output signal of the first flip flop circuit ($F_1$) is in the H level, an H level signal which is outputted from the second flip flop circuit ($F_2$) is inputted through the first gate line $105_2$ to each of the pixels $107_{21}$ to $107_{2m}$ arranged in the second row in the pixel portion 101. Accordingly, each of the pixels $107_{21}$ to $107_{2m}$ arranged in the second row and the source driver 102 are electrically connected, so that an image signal is inputted from the source driver 102 to each of the pixels $107_{21}$ to $107_{2m}$ arranged in the second row. In addition, an H level signal is outputted from the first transfer signal generation circuit ($T_1$) and inputted to the first input terminal of the third flip flop circuit ($F_3$).

From a period T4, the above-described operations are repeated. That is, an H level signal is sequentially outputted from the next flip flop circuits from the third flip flop circuit ($F_3$), so that an image signal is inputted to a plurality of arranged pixels in each row.

The display device described in this embodiment is an active-matrix display device including a first gate driver and a second gate driver. Further, the first gate driver and the second gate driver each include a plurality of flip flop circuits and a plurality of transfer signal generation circuits. Both the flip flop circuit and the transfer signal generation circuit are circuits which output a signal inputted to a first input terminal with a half clock cycle delay. In addition, an output terminal of the transfer signal generation circuit is directly connected to a first input terminal of the flip flop circuit in the next stage. Therefore, delay and distortion of the signal which is inputted from the transfer signal generation circuit to the flip flop circuit can be reduced.

Note that, in this embodiment, an example of a display device including one source driver and two gate drivers are described. However, an embodiment of the present invention is not limited to this structure. For example, the following structures are also one of embodiments of the present invention: a structure where a display device only includes two gate drivers and an image signal is inputted from the outside, a structure where a display device includes two source drivers and two gate drivers and an image signal is inputted from the two source drivers, and a structure where each pixel is electrically connected to a gate driver through two gate lines.

Embodiment 2

In Embodiment 2, a specific example of a circuit which can be applied to the flip flop circuit and the transfer signal generation circuit described in Embodiment 1 is described with reference to FIG. 4 and FIG. 5. Specifically, an example of forming a flip flop circuit and a transfer signal generation circuit using transistors is illustrated. Note that since a source terminal and a drain terminal of a transistor change depending on the structure, the operating condition, and the like of the transistor, it is difficult to define which is a source terminal or a drain terminal. Therefore, one of a source terminal and a drain terminal is referred to as a first terminal and the other thereof is referred to as a second terminal for distinction, hereinafter.

[An Example of a Circuit Structure]

Figure 4:
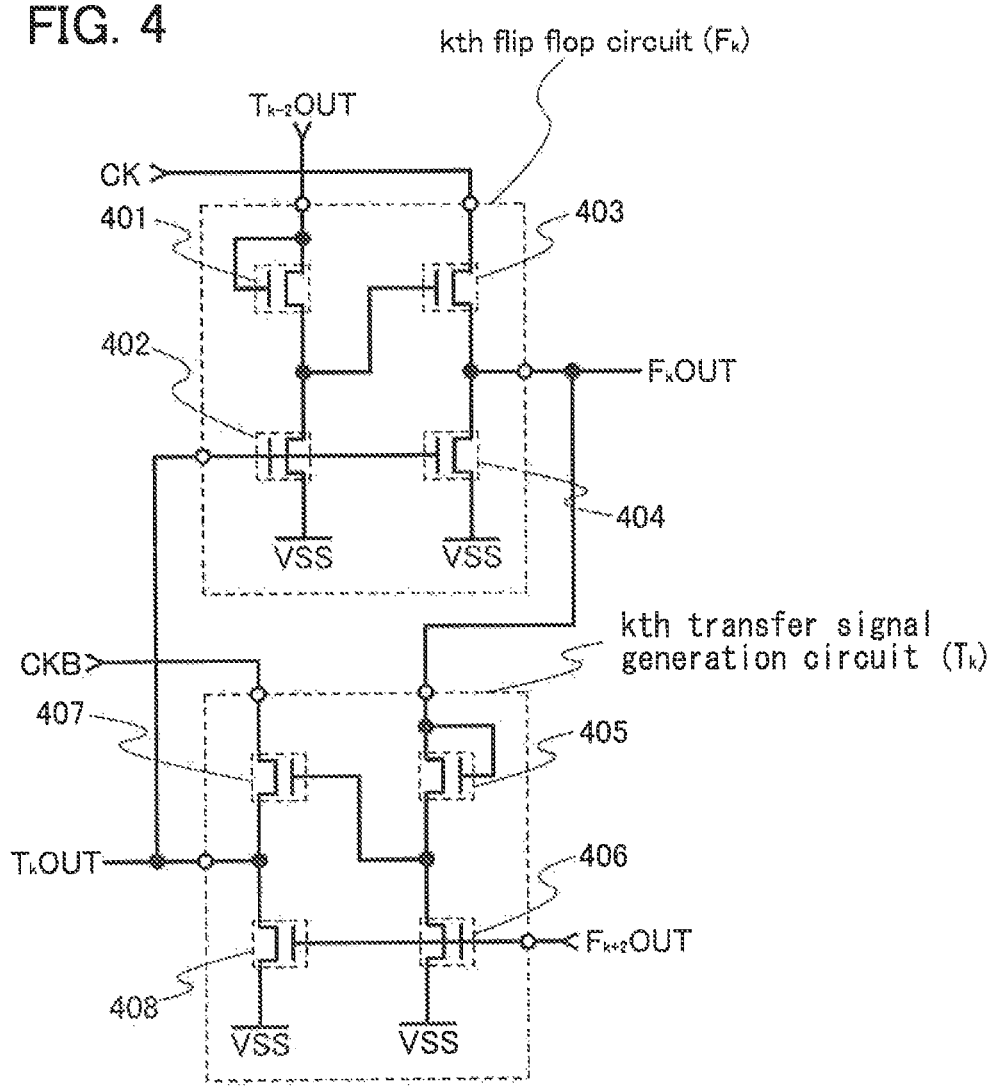
FIG. 4 illustrates a specific example of a circuit structure described in Embodiment 2.

FIG. 4 is a diagram illustrating an example of a circuit which can be applied to the k-th flip flop circuit ($F_k$) and the k-th transfer signal generation circuit ($T_k$) included in the first gate driver 103A described in Embodiment 1. Note that a k-th flip flop circuit ($F_k$) described in Embodiment 2 includes a first transistor 401 to a fourth transistor 404 and a k-th transfer signal generation circuit ($T_k$) includes a fifth transistor 405 to an eighth transistor 408. In addition, in Embodiment 2, an output signal ($T_k$OUT) of the k-th transfer signal generation circuit is used as a stop pulse signal (STP($F_k$)) for the k-th flip flop circuit. An output signal ($F_{k+2}$OUT) of a (k+2)th flip flop circuit is used as a stop pulse signal (STP($T_k$)) for the k-th transfer signal generation circuit.

In the first transistor 401, a gate terminal and a first terminal are electrically connected to an output terminal of a (k−2)th transfer signal generation circuit (not shown).

A gate terminal of the second transistor 402 is electrically connected to an output terminal of the k-th transfer signal generation circuit ($T_k$), a first terminal of the second transistor 402 is electrically connected to a ground potential (VSS) line, and a second terminal of the second transistor 402 is electrically connected to a second terminal of the first transistor 401.

A gate terminal of the third transistor 403 is electrically connected to the second terminal of the first transistor 401 and the second terminal of the second transistor 402, a first terminal of the third transistor 403 is electrically connected to a clock signal (CK) line, and a second terminal of the third transistor 403 is electrically connected to a first input terminal of the k-th transfer signal generation circuit ($T_k$).

A gate terminal of the fourth transistor 404 is electrically connected to the output terminal of the k-th transfer signal generation circuit ($T_k$), a first terminal of the fourth transistor 404 is electrically connected to the ground potential (VSS) line, and a second terminal of the fourth transistor 404 is electrically connected to the first input terminal of the k-th transfer signal generation circuit ($T_k$) and the second terminal of the third transistor 403.

A gate terminal and a first terminal of the fifth transistor 405 are electrically connected to an output terminal of the k-th flip flop circuit ($F_k$).

A gate terminal of the sixth transistor 406 is electrically connected to an output terminal of the (k+2)th flip flop circuit (not shown), a first terminal of the sixth transistor 406 is electrically connected to the ground potential (VSS) line, and a second terminal of the sixth transistor 406 is electrically connected to a second terminal of the fifth transistor 405.

A gate terminal of the seventh transistor 407 is electrically connected to the second terminal of the fifth transistor 405 and the second terminal of the sixth transistor 406, a first terminal of the seventh transistor 407 is electrically connected to an inverted clock signal (CKB) line, a second terminal of the seventh transistor 407 is electrically connected to a third input terminal of the k-th flip flop circuit ($F_k$) and a first input terminal of the (k+2)th flip flop circuit (not shown).

A gate terminal of the eighth transistor 408 is electrically connected to the output terminal of the (k+2)th flip flop circuit (not shown), a first terminal of the eighth transistor 408 is electrically connected to the ground potential (VSS) line, and a second terminal of the eighth transistor 408 is electrically connected to the third input terminal of the k-th flip flop circuit ($F_k$), the first input terminal of the (k+2)th flip flop circuit (not shown), and the second terminal of the seventh transistor 407.

As illustrated in FIG. 4, the same circuit structure can be applied to the k-th flip flop circuit ($F_k$) and the k-th transfer signal generation circuit ($T_k$). Note that points described below are preferably considered when a circuit is designed.

The k-th flip flop circuit ($F_k$) is a circuit for driving a k-th gate line. The k-th transfer signal generation circuit ($T_k$) is a circuit for driving the (k+2)th flip flop circuit. The k-th gate line has various parasitic capacitance and parasitic resistance as described above. Therefore, the load of the k-th flip flop circuit ($F_k$) is heavier than the load of the k-th transfer signal generation circuit ($T_k$). That is, when the above circuit is designed, the current driving capability of the first transistor 401 is preferably higher than the current driving capability of the fifth transistor 405. For example, the channel width of the first transistor 401 may be larger than the channel width of the fifth transistor 405. For the same reason, it is preferable that the current driving capability of the second transistor 402 be higher than the current driving capability of the sixth transistor 406, the current driving capability of the third transistor 403 be higher than the current driving capability of the seventh transistor 407, and the current driving capability of the fourth transistor 404 be higher than the current driving capability of the eighth transistor 408. For example, the current driving capability can be higher by making a ratio of the channel width to the channel length (the channel width/the channel length (W/L)) larger.

Further, the third transistor 403 which directly contributes to driving of the k-th gate line preferably has the highest current driving capability among the first transistor 401 to the fourth transistor 404 included in the k-th flip flop circuit ($F_k$). Similarly, the seventh transistor 407 which directly contributes to a driving of the (k+2)th flip flop circuit preferably has the highest current driving capability among the fifth transistor 405 to the eighth transistor 408 included in the k-th transfer signal generation circuit ($T_k$).

In addition, the circuit structure illustrated in FIG. 4 can be applied to the first flip flop circuit ($F_1$) and the first transfer signal generation circuit ($T_1$) included in the first gate driver 103A. Note that, in the first flip flop circuit ($F_1$), what is different from the structure illustrated in FIG. 4 is that the gate terminal and the first terminal of the first transistor 401 are electrically connected to the first start pulse signal (SP1) line.

Further, the circuit structure illustrated in FIG. 4 can be applied to the (k+1)th flip flop circuit ($F_{k+1}$) and the (k+1)th transfer signal generation circuit ($T_{k+1}$) included in the second gate driver 103B. Note that, in the (k+1)th flip flop circuit ($F_{k+1}$) and the (k+1)th transfer signal generation circuit ($T_{k+1}$), what is different from the structure illustrated in FIG. 4 is that the first terminal of the third transistor 403 is electrically connected to the inverted clock signal (CKB) line and that the first terminal of the seventh transistor 407 is electrically connected to the clock signal (CK) line.

Furthermore, the circuit structure illustrated in FIG. 4 can be applied to the second flip flop circuit ($F_2$) and the second transfer signal generation circuit ($T_2$) included in the second gate driver 103B. Note that, in the second flip flop circuit ($F_2$) and the second transfer signal generation circuit ($T_2$), the difference from the structure in FIG. 4 is as follows: the gate terminal and the first terminal of the first transistor 401 are electrically connected to the second start pulse signal (SP2) line, the first terminal of the transistor 403 is electrically connected to the inverted clock signal (CKB) line, and the first terminal of the seventh transistor 407 is electrically connected to the clock signal (CK) line.

Note that, in Embodiment 2, an output signal ($F_{k+2}$OUT) of the (k+2)th flip flop circuit is used as the stop pulse (STP($T_k$)) for the k-th transfer signal generation circuit. Therefore, for a plurality of pixels arranged in n rows, an (n+1)th flip flop circuit needs to be provided as a dummy circuit in the first gate driver 103A, and an (n+2)th flip flop circuit needs to be provided as a dummy circuit in the second gate driver 103B. Note that as the dummy circuit, a flip flop circuit which only supplies a stop pulse signal for the transfer signal generation circuit and does not drive a gate line can be used. Alternatively, by providing a wiring (a dummy gate line) which does not contribute to display together with the dummy circuit, a flip flop circuit which supplies a stop pulse signal for a transfer signal generation circuit and drives the wiring can be used as the dummy circuit.

[An Example of a Circuit Operation]

Figure 5:
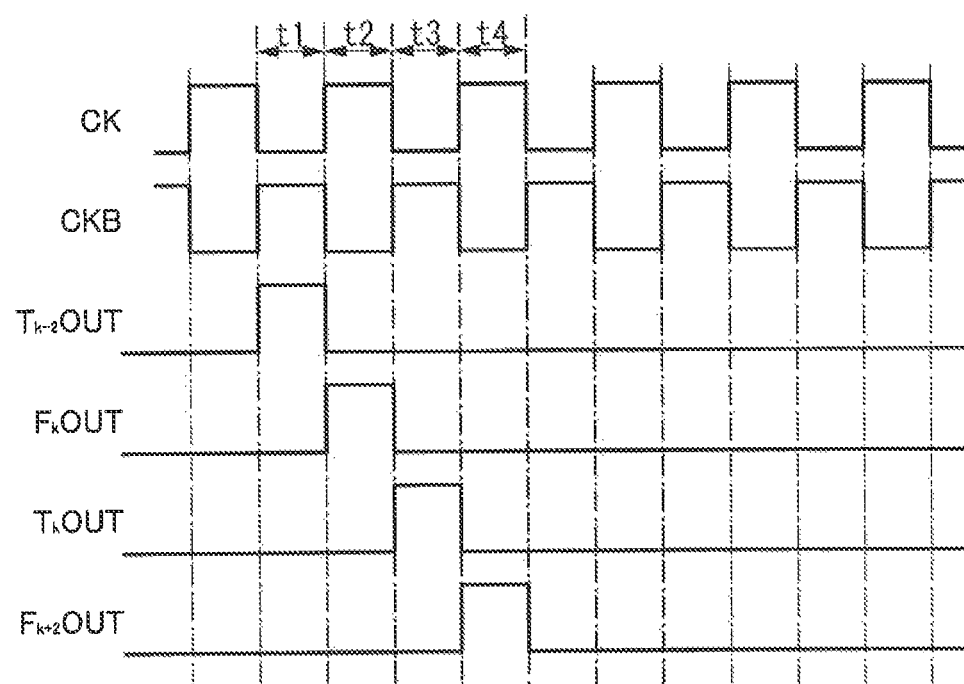
FIG. 5 illustrates a timing chart of a circuit described in Embodiment 2.

FIG. 5 is a timing chart of input signals and output signals of the k-th flip flop circuit ($F_k$) and the k-th transfer signal generation circuit ($T_k$) illustrated in FIG. 4. Operations of the k-th flip flop circuit ($F_k$) and the k-th transfer signal generation circuit ($T_k$) are described below.

In a period t1, an output signal ($T_{k-2}$OUT) of the (k-2)th transfer signal generation circuit goes to an H level. Thus, the first transistor 401 which is diode-connected is turned on, and a potential of the gate terminal of the third transistor 403 is increased to the H level. Therefore, a clock signal (CK) which is in an L level in the period t1 is outputted as an output signal ($F_k$OUT) of the k-th flip flop circuit.

In a period t2, the output signal ($T_{k-2}$OUT) of the (k−2)th transfer signal generation circuit goes to the L level and the clock signal (CK) goes to the H level. Thus, the first transistor 401 which is diode-connected is turned off; accordingly, a potential of the gate terminal of the third transistor 403 at a floating state is raised by an H level signal inputted to the first terminal of the third transistor 403 (a bootstrap operation) and further increased. Further, the third transistor 403 remains ON, and an H level signal is outputted as the output signal ($F_k$OUT) of the k-th flip flop circuit ($F_k$). This H level signal is inputted to the gate terminal and the first terminal of the fifth transistor 405. Thus, the fifth transistor 405 which is diode-connected is turned on; accordingly, a potential of the gate terminal of the seventh transistor 407 is increased up to the H level. Therefore, an inverted clock signal (CKB) which is in the L level in the period t2 is outputted as an output signal ($T_k$OUT) of the k-th transfer signal generation circuit ($T_k$).

In a period t3, the clock signal goes to the L level and the inverted clock signal (CKB) goes to the H level. Thus, the fifth transistor 405 which is diode-connected is turned off; accordingly, a potential of the gate terminal of the seventh transistor 407 at a floating state is raised by an H level signal inputted to the first terminal of the seventh transistor 407 (a bootstrap operation) and further increased. Further, the seventh transistor 407 remains ON, and an H level signal is outputted to the output signal ($T_k$OUT) of the k-th transfer signal generation circuit ($T_k$). This H level signal is inputted to the gate terminals of the second transistor 402 and the fourth transistor 404. Thus, the second transistor 402 is turned on, and a potential of the gate terminal of the third transistor 403 goes to the L level. Therefore the third transistor 403 is turned off. In addition, since the fourth transistor 404 is turned on, the L level signal is outputted as the output signal ($F_k$OUT) of the k-th flip flop circuit ($F_k$).

In a period t4, the output signal ($F_{k+2}$OUT) of the (k+2)th flip flop circuit goes to the H level. Thus, the sixth transistor 406 is turned on and a potential of the gate terminal of the seventh transistor 407 goes to the L level. Therefore, the seventh transistor 407 is turned off. Further, since the eighth transistor 408 is also turned on, the L level signal is outputted as the output signal ($T_k$OUT) of the k-th transfer signal generation circuit ($T_k$).

Note that a circuit operation of the following circuits is the same as the circuit operation of the above-described k-th flip flop circuit ($F_k$) and k-th transfer signal generation circuit ($T_k$): the first flip flop circuit and the first transfer signal generation circuit, the (k+1)th flip flop circuit and the (k+1)th transfer signal generation circuit, and the second flip flop circuit and the second transfer signal generation circuit.

Modification Example

In Embodiment 2, an output signal of the k-th transfer signal generation circuit ($T_k$) and an output signal of the (k+2)th flip flop circuit ($F_{k+2}$) are used as a stop pulse signal (STP($F_k$)) for the k-th flip flop circuit and a stop pulse signal (STP($T_k$)) for the k-th transfer signal generation circuit, respectively. However, the structure of Embodiment 2 is not limited thereto.

For example, an output signal of the (k+1)th flip flop circuit ($F_{k+1}$) and an output signal of the (k+1)th transfer signal generation circuit ($T_{k+1}$) can be used as a stop pulse signal (STP($F_k$)) for the k-th flip flop circuit and a stop pulse signal (STP($T_k$)) for the k-th transfer signal generation circuit, respectively. In this case, the stop pulse signal (STP($F_k$)) for the k-th flip flop circuit and the stop pulse signal (STP($T_k$)) for the k-th transfer signal generation circuit are delayed or distorted signals as compared with those in the above structure. However, since an output signal of the k-th flip flop circuit ($F_k$) and an output signal of the k-th transfer signal generation circuit ($T_k$) in the period go into the L level, a delayed or distorted signal does not provide a serious problem.

Embodiment 3

In Embodiment 3, a specific example of a circuit which can be applied to the flip flop circuit and the transfer signal generation circuit described in Embodiment 1, which is different from a specific example in Embodiment 2, is described with reference to FIG. 6 and FIGS. 7A and 7B.

[An Example of a Circuit Structure]

Figure 6:
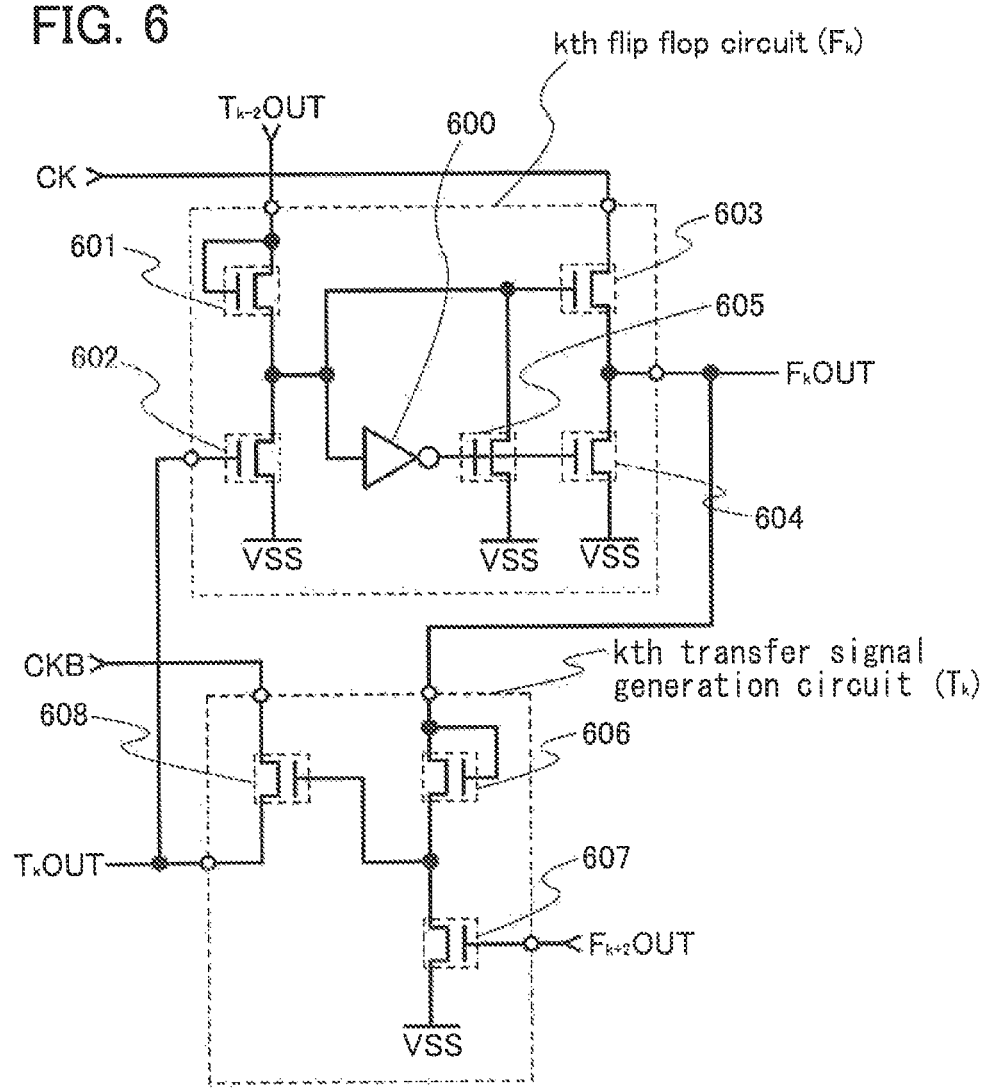
FIG. 6 illustrates a specific example of a circuit structure described in Embodiment 3.

FIG. 6 illustrates an example of a circuit which can be applied to the k-th flip flop circuit ($F_k$) and the k-th transfer signal generation circuit ($T_k$) included in the first gate driver 103A described in Embodiment 1. In Embodiment 3, a k-th flip flop circuit ($F_k$) includes a first transistor 601 to a fifth transistor 605 and an inverter circuit 600, and a k-th transfer signal generation circuit ($T_k$) includes a sixth transistor 606 to an eighth transistor 608. Note that, in other words, the circuit illustrated in FIG. 6 is made as follows: the inverter circuit 600 and the fifth transistor 605 are added to the k-th flip flop circuit ($F_k$) illustrated in FIG. 4 and the eighth transistor 408 is eliminated from the k-th transfer signal generation circuit ($T_k$) illustrated in FIG. 4.

The electrical connection relationship between the first transistor 601, the second transistor 602, and the third transistor 603 is the same as that in the circuit illustrated in FIG. 4. Therefore, the description in Embodiment 2 applies here.

An input terminal of the inverter circuit 600 is electrically connected to a second terminal of the first transistor 601, a second terminal of the second transistor 602, and a gate terminal of the third transistor 603.

A gate terminal of the fourth transistor 604 is electrically connected to an output terminal of the inverter circuit 600, a first terminal of the fourth transistor 604 is electrically connected to a ground potential (VSS) line, and a second terminal of the fourth transistor 604 is electrically connected to a second terminal of the third transistor 603 and a first input terminal of the k-th transfer signal generation circuit ($T_k$).

A gate terminal of the fifth transistor 605 is electrically connected to the output terminal of the inverter circuit 600, a first terminal of the fifth transistor 605 is electrically connected to the ground potential (VSS) line, and a second terminal of the fifth transistor 605 is electrically connected to the second terminal of the first transistor 601, the second terminal of the second transistor 602, the gate terminal of the third transistor 603, and the input terminal of the inverter circuit 600.

The k-th transfer signal generation circuit ($T_k$) illustrated in FIG. 6 is a circuit in which the eighth transistor 408 is eliminated from the k-th transfer signal generation circuit ($T_k$) illustrated in FIG. 4. The electrical connection relationship between the other transistors is the same as that in the circuit illustrated in FIG. 4. Therefore, the description in Embodiment 2 applies here.

Note that the circuit illustrated in FIG. 6 needs to be designed as described below.

The circuit illustrated in FIG. 6 needs to be designed so that an H level signal is surely inputted to the input terminal of the inverter circuit 600 when an H level signal is inputted into the k-th flip flop circuit ($F_k$) (the first transistor 601 which is diode-connected). More specifically, the current driving capability of the first transistor 601 needs to be higher than the current driving capability of the fifth transistor 605. For example, the channel width of the first transistor 601 needs to be larger than the channel width of the fifth transistor 605.

Further, in the period t4 illustrated in FIG. 5, an output signal ($T_k$OUT) of the k-th transfer signal generation circuit goes to an L level. More specifically, the current driving capability of the eighth transistor 608 needs to be higher than the current driving capability of the seventh transistor 607. Thus, the output signal ($T_k$OUT) of the k-th transfer signal generation circuit can be reduced to an L level which is equal to an inverted clock signal (CKB) level in the period t4 before the following operation: an H level signal is inputted to a gate terminal of the seventh transistor 607, the seventh transistor 607 is turned on, a ground potential (VSS) is inputted to a gate terminal of the eighth transistor 608, and then, the eighth transistor 608 is turned off.

Further, the description in Embodiment 2 is preferably taken into consideration when the circuit illustrated in FIG. 6 is designed.

That is, it is preferable that the current driving capability of the first transistor 601 be higher than the current driving capability of the sixth transistor 606, the current driving capability of the second transistor 602 be higher than the current driving capability of the seventh transistor 607, and the current driving capability of the third transistor 603 be higher than the current driving capability of the eighth transistor 608.

Furthermore, it is preferable that the third transistor 603 have the highest current driving capability among the first transistor 601 to the fifth transistor 605 included in the k-th flip flop circuit ($F_k$). In addition, it is preferable that the eighth transistor 608 have the highest current driving capability among the sixth transistor 606 to the eighth transistor 608 included in the k-th transfer signal generation circuit ($T_k$).

Note that the circuit in FIG. 6 can also be applied to a (k+1)th flip flop circuit, a (k+1)th transfer signal generation circuit, and the like though FIG. 6 illustrates only the k-th flip flop circuit ($F_k$) and the k-th transfer signal generation circuit ($T_k$). Note that as described in Embodiment 2, part of the electrical connection relationship of terminals is different. The description of Embodiment 2 applies to a specific difference of the connection relationship.

Figure 7A:
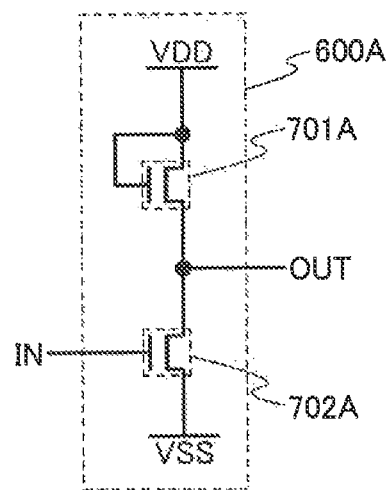
FIGS. 7A and 7B each illustrate a specific example of an inverter circuit described in Embodiment 3.
Figure 7B:
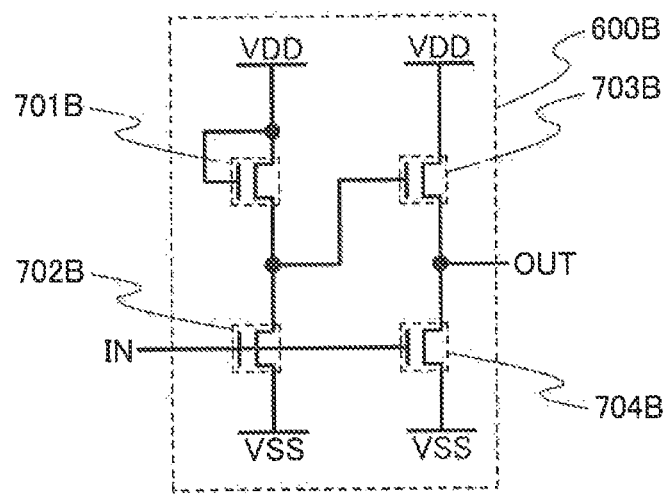

FIGS. 7A and 7B are diagrams illustrating specific examples of a circuit which can be applied to the inverter circuit 600 illustrated in FIG. 6. Note that in FIGS. 7A and 7B, a wiring denoted by "IN" is an input wiring and a wiring denoted by "OUT" is an output wiring.

An inverter circuit 600A illustrated in FIG. 7A includes a transistor 701A which is diode-connected and a transistor 702A.

A gate terminal and a first terminal of the transistor 701A are electrically connected to a power supply (VDD) line, and a second terminal of the transistor 701A is electrically connected to an output terminal of the inverter circuit 600A.

A gate terminal of the transistor 702A is electrically connected to an input terminal of the inverter circuit 600A, a first terminal of the transistor 702A is electrically connected to a ground potential (VSS) line, and a second terminal of the transistor 702A is electrically connected to an output terminal of the inverter circuit 600A and the second terminal of the transistor 701A.

Since the inverter circuit 600A illustrated in FIG. 7A is formed using the two transistors 701A and 702B, an increase in the circuit area can be minimized.

Note that, in the case where the inverter circuit 600A illustrated in FIG. 7A is applied to the inverter circuit 600 in FIG. 6, the circuit needs to be designed so that an output signal is in the L level when the transistor 702A is ON. More specifically, the current driving capability of the transistor 702A needs to be higher than the current driving capability of the transistor 701A. For example, the channel length of the transistor 702A needs to be smaller than the channel length of the transistor 701A, or the channel width of the transistor 702A needs to be larger than the channel width of the transistor 701A.

The inverter circuit 600B illustrated in FIG. 7B includes a transistor 701B which is diode-connected, a transistor 702B, a transistor 703B, and a transistor 704B.

A gate terminal and a first terminal of the transistor 701B are electrically connected to the power supply (VDD) line.

A gate terminal of the transistor 702B is electrically connected to an input terminal of the inverter circuit 600B, a first terminal of the transistor 702B is electrically connected to the ground potential (VSS) line, and a second terminal of the transistor 702B is electrically connected to a second terminal of the transistor 701B.

A gate terminal of the transistor 703B is electrically connected to the second terminal of the transistor 701B and the second terminal of the transistor 702B, a first terminal of the transistor 703B is electrically connected to the power supply potential (VDD) line, and a second terminal of the transistor 703B is electrically connected to an output terminal of the inverter circuit 600B.

A gate terminal of the transistor 704B is electrically connected to the input terminal of the inverter circuit 600B, a first terminal of the transistor 704B is electrically connected to the ground potential (VSS) line, and a second terminal of the transistor 704B is electrically connected to the output terminal of the inverter circuit 600B and the second terminal of the transistor 703B.

In the inverter circuit 600B illustrated in FIG. 7B, the transistor 701B which is diode-connected is not directly connected to the output terminal of the inverter circuit 600B. Therefore, an output signal can be prevented from being decreased from the power supply potential (VDD) or increased from the ground potential (VSS).

Note that, in the case where the inverter circuit 600B illustrated in FIG. 7B is applied to the inverter circuit 600 illustrated in FIG. 6, the circuit needs to be designed so that the transistor 703B is turned off when the transistor 702B is ON. More specifically, the current driving capability of the transistor 702B needs to be higher than the current driving capability of the transistor 701B. For example, the channel length of the transistor 702B needs to be smaller than the channel length of the transistor 701B, or the channel width of the transistor 702B needs to be larger than the channel width of the transistor 701B.

[Difference from the Circuit Described in Embodiment 2]

The k-th flip flop circuit ($F_k$) illustrated in FIG. 6 includes the inverter circuit 600 and the fifth transistor 605 whose gate terminal is electrically connected to the output terminal of the inverter circuit 600, first terminal is electrically connected to the ground potential (VSS) line, and second terminal is electrically connected to the input terminal of the inverter circuit 600. Thus, the fifth transistor 605 which is electrically connected to the inverter circuit 600 is always ON once the fifth transistor 605 is turned on. When the fifth transistor 605 is ON, a potential of the gate terminal of the third transistor 603 is maintained at the ground potential (VSS). Therefore, even when noises enter the gate terminal of the third transistor 603, the third transistor 603 is not turned on. That is, an image or a picture of a display device is not defected and high performance of the display device can be realized.

Since the k-th transfer signal generation circuit ($T_k$) illustrated in FIG. 6 is formed using the three transistors 606 to 608, the circuit area can be reduced.

Modification Example

In Embodiment 3, an example of the flip flop circuit formed using the five transistors 601 to 605 and the inverter circuit 600, and the transfer signal generation circuit formed using the three transistors 606 to 608 is described. However, an embodiment is not limited to such a structure. For example, both the k-th flip flop circuit ($F_k$) and the k-th transfer signal generation circuit ($T_k$) may have the same structure as the k-th flip flop circuit ($F_k$) or the k-th transfer signal generation circuit ($T_k$) illustrated in FIG. 6. Further, the flip flop circuit and the transfer signal generation circuit can be formed by combination of the circuit in Embodiment 2 (FIG. 4) and the circuit in Embodiment 3 (FIG. 6).

Furthermore, in Embodiment 3, the output signal of the k-th transfer signal generation circuit ($T_k$) and the output signal of the (k+2)th flip flop circuit ($F_{k+2}$) are applied to the stop pulse signal (STP($F_k$)) for the k-th flip flop circuit and the stop pulse signal (STP($T_k$)) for the k-th transfer signal generation circuit, respectively. However, a structure in Embodiment 3 is not limited to such a structure.

Embodiment 4

In Embodiment 4, a specific example of a circuit which can be applied to the flip flop circuit and the transfer signal generation circuit described in Embodiment 1, which is different from a specific example in Embodiments 2 and 3, is described with reference to FIG. 8 and FIGS. 9A and 9B.

[An Example of a Circuit Structure]

Figure 8:
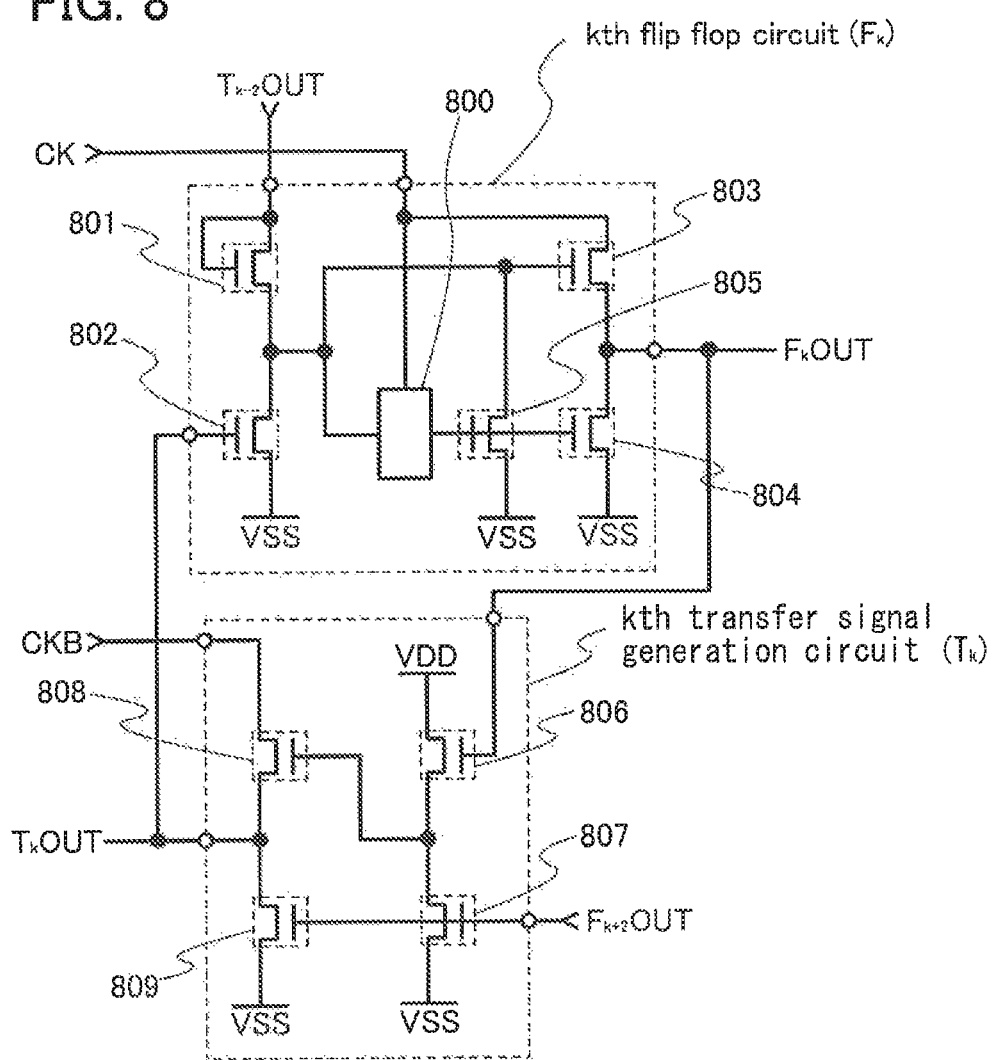
FIG. 8 illustrates a specific example of a circuit structure described in Embodiment 4.

FIG. 8 illustrates an example of a circuit which can be applied to the k-th flip flop circuit ($F_k$) and the k-th transfer signal generation circuit ($T_k$) included in the first gate driver 103A which is described in Embodiment 1. In Embodiment 4, a k-th flip flop circuit ($F_k$) includes a first transistor 801 to a fifth transistor 805 and an control circuit 800, and a k-th transfer signal generation circuit ($T_k$) includes a sixth transistor 806 to a ninth transistor 809. Note that, in other words, the circuit illustrated in FIG. 8 is made as follows: the control circuit 800 and the fifth transistor 805 are added to the circuit illustrated in FIG. 4 and a first terminal of the sixth transistor 806 (corresponding to the fifth transistor 405 in FIG. 4) is electrically connected to a power supply potential (VDD) line not to a gate terminal of the transistor 806.

The electrical connection relationship between the first transistor 801, the second transistor 802, and the third transistor 803 is the same as that in the circuit illustrated in FIG. 4 and FIG. 6. Therefore, the description in Embodiment 2 applies here.

A first input terminal of the control circuit 800 is electrically connected to a second terminal of the first transistor 801, a second terminal of the second transistor 802, and a gate terminal of the third transistor 803, and a second input terminal of the control circuit 800 is electrically connected to the clock signal (CK) line.

A gate terminal of the fourth transistor 804 is electrically connected to an output terminal of the control circuit 800, a first terminal of the fourth transistor 804 is electrically connected to the ground potential (VSS) line, and a second terminal of the fourth transistor 804 is electrically connected to a second terminal of the third transistor 803 and a first input terminal of the k-th transfer signal generation circuit ($T_k$).

A gate terminal of the fifth transistor 805 is electrically connected to the output terminal of the control circuit 800, a first terminal of the fifth transistor 805 is electrically connected to the ground potential (VSS) line, a second terminal of the fifth transistor 805 is electrically connected to the second terminal of the first transistor 801, the second terminal of the second transistor 802, the gate terminal of the third transistor 803, and a first input terminal of the control circuit 800.

A gate terminal of the sixth transistor 806 is electrically connected to an output terminal of the k-th flip flop circuit ($F_k$), and a first terminal of the sixth transistor 806 is electrically connected to the power supply potential (VDD) line.

The electrical connection relationship between the seventh transistor 807, the eighth transistor 808, and the ninth transistor 809 is the same as that of the sixth transistor 606, the seventh transistor 607, and the eighth transistor 608 illustrated in FIG. 6. Therefore, the description in Embodiment 2 applies here.

Note that the circuit illustrated in FIG. 8 needs to be designed as described below.

The circuit illustrated in FIG. 8 needs to be designed so that an H level signal is surely inputted to the input terminal of the control circuit 800 when an H level signal is inputted into the k-th flip flop circuit ($F_k$) (the first transistor 801 which is diode-connected). More specifically, the current driving capability of the first transistor 801 needs to be higher than the current driving capability of the fifth transistor 805. For example, the channel width of the first transistor 801 needs to be larger than the channel width of the fifth transistor 805.

Further, the description in Embodiment 2 is preferably taken into consideration when a circuit illustrated in FIG. 8 is designed.

That is, it is preferable that the current driving capability of the first transistor 801 be higher than the current driving capability of the sixth transistor 806, the current driving capability of the second transistor 802 be higher than the current driving capability of the seventh transistor 807, the current driving capability of the third transistor 803 be higher than the current driving capability of the eighth transistor 808, and the current driving capability of the fourth transistor 804 be higher than the current driving capability of the ninth transistor 809.

Furthermore, it is preferable that the third transistor 803 have the highest current driving capability among the first transistor 801 to the fifth transistor 805 included in the k-th flip flop circuit ($F_k$). In addition, it is preferable that the eighth transistor 808 have the highest current driving capability among the sixth transistor 806 to the ninth transistor 809 included in the k-th transfer signal generation circuit ($T_k$).

The circuit in FIG. 8 can be applied to the (k+1)th flip flop circuit ($F_{k+1}$), the (k+1)th transfer signal generation circuit ($T_{k+1}$), and the like though FIG. 8 illustrates only the k-th flip flop circuit ($F_k$) and the k-th transfer signal generation circuit ($T_k$). Note that as described in Embodiment 2, part of the electrical connection relationship of terminals is different. The description of Embodiment 2 applies to a specific difference of the connection relationship.

Figure 9A:
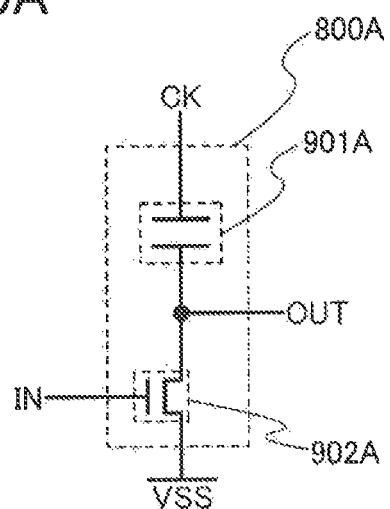
FIGS. 9A and 9B each illustrate a specific example of a control circuit described in Embodiment 4.
Figure 9B:
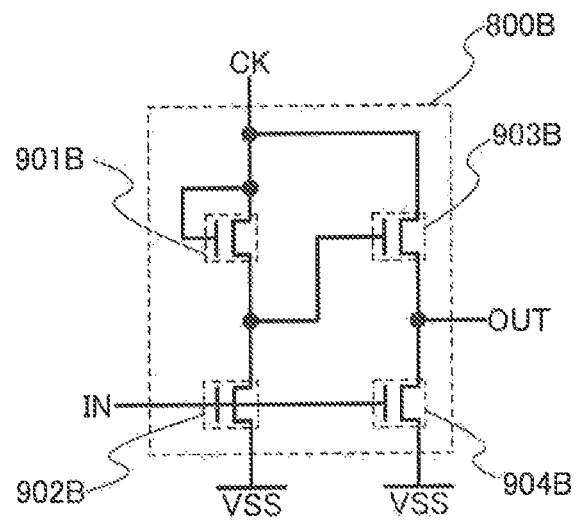
Figure 10:
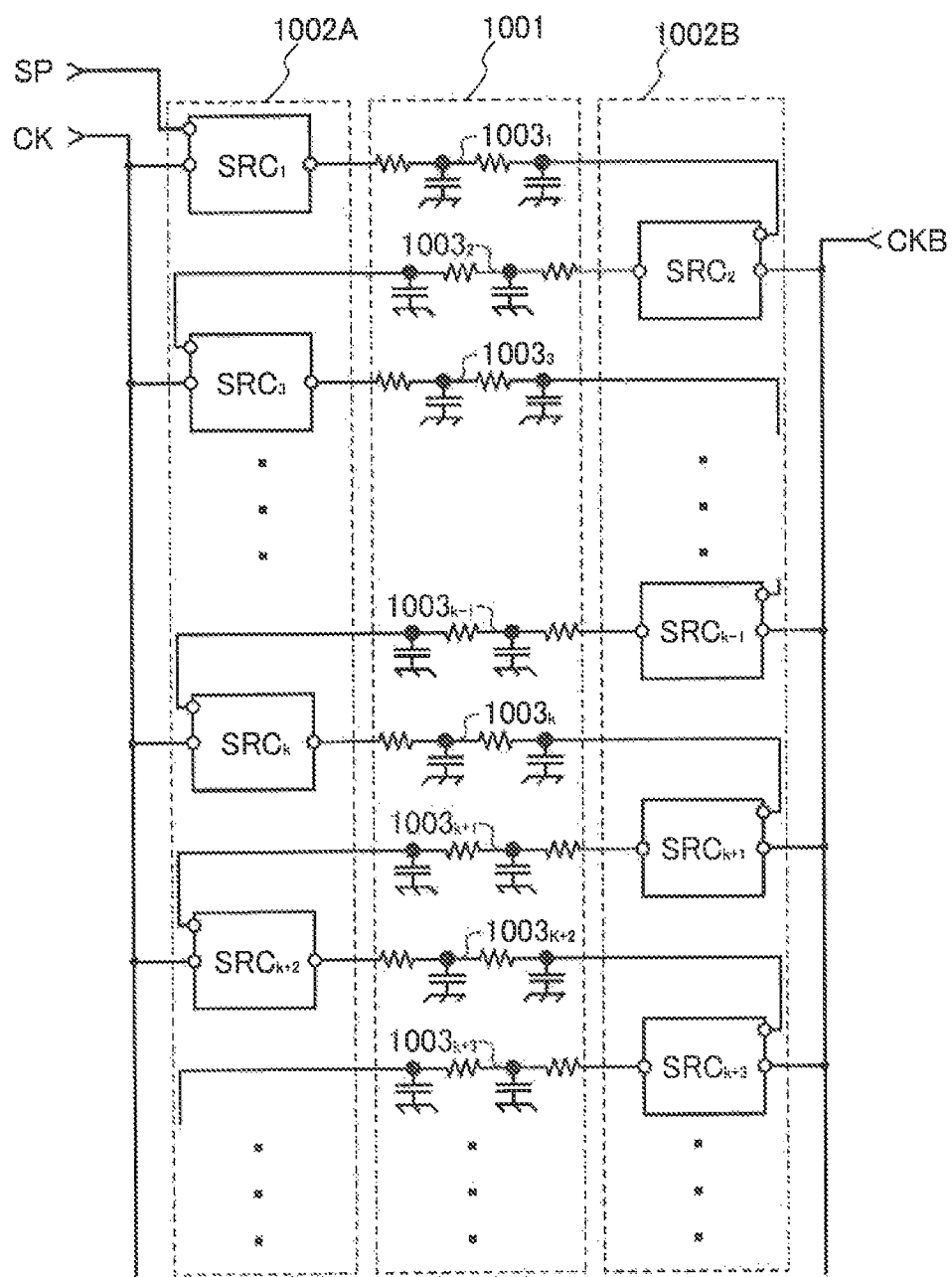
FIG. 10 illustrates a structure of a gate driver shown in Patent Document 1.

FIGS. 9A and 9B are diagrams illustrating specific examples of a circuit which can be applied to the control circuit 800 illustrated in FIG. 8. In FIGS. 9A and 9B, a wiring denoted by "IN" is a first input wiring, a wiring denoted by "CK" is a second input wiring which is electrically connected to a clock signal (CK) line, and a wiring denoted by "OUT" is an output wiring.

The control circuit 800A illustrated in FIG. 9A includes a capacitor element 901A and a transistor 902A.

One of terminals of the capacitor element 901A is electrically connected to the clock signal (CK) line and the other terminal is electrically connected to an output terminal of the control circuit 800A.

A gate terminal of the transistor 902A is electrically connected to a first input terminal of the control circuit 800A, a first terminal of the transistor 902A is electrically connected to a ground potential (VSS) line, and a second terminal of the transistor 902A is electrically connected to the output terminal of the control circuit 800A and the other terminal of the capacitor element 901A.

After the period t3 in FIG. 5, the L level signal is inputted to the first input terminal of the control circuit 800A and the transistor 902A is turned off. Accordingly, an output signal of the control circuit 800A becomes in a floating state. Therefore, as an output signal of the control circuit 800A, a signal which is tuned to the clock signal (CK) is outputted.

Note that in the case where the control circuit 800A illustrated in FIG. 9A is applied to the control circuit 800 in FIG. 8, the control circuit 800A needs to be designed so that when transition from the period t2 to the period t3 occurs, its output terminal goes into a floating state after a potential of one of the terminals of the capacitor element 901A goes to an L level.

The control circuit 800B illustrated in FIG. 9B includes a transistor 901B which is diode-connected, a transistor 902B, a transistor 903B, and a transistor 904B.

A gate terminal and a first terminal of the transistor 901B are electrically connected to a clock signal (CK) line.

A gate terminal of the transistor 902B is electrically connected to a first input terminal of the control circuit 800B, a first terminal of the transistor 902B is electrically connected to a ground potential (VSS) line, and a second terminal of the transistor 902B is electrically connected to a second terminal of the transistor 901B.

A gate terminal of the transistor 903B is electrically connected to the second terminal of the transistor 901B and the second terminal of the transistor 902B, a first terminal of the transistor 903B is electrically connected to the clock signal (CK) line, and a second terminal of the transistor 903B is electrically connected to an output terminal of the control circuit 800B.

A gate terminal of the transistor 904B is electrically connected to the input terminal of the control circuit 800B, a first terminal of the transistor 904B is electrically connected to the ground potential (VSS) line, and a second terminal of the transistor 904B is electrically connected to the output terminal of the control circuit 800B and the second terminal of the transistor 903B.

Note that, in the case where the control circuit 800B illustrated in FIG. 9B is applied to the control circuit 800 illustrated in FIG. 8, the circuit needs to be designed so that the transistor 903B is turned off when the transistor 902B is ON. More specifically, the current driving capability of the transistor 902B needs to be higher than the current driving capability of the transistor 901B. For example, the channel length of the transistor 902B needs to be smaller than the channel length of the transistor 901B, or the channel width of the transistor 902B needs to be larger than the channel width of the transistor 901B.

[Difference from the Circuit Described in Embodiments 2 and 3]

The control circuits 800A and 800B illustrated in FIGS. 9A and 9B output a clock signal (CK) or a signal tuned to the clock signal (CK). Therefore, even when noises enter the gate terminal of the third transistor 803, the noises can be eliminated when the fourth transistor 804 and the fifth transistor 805 are turned on. Further, the fourth transistor 804 and the fifth transistor 805 are not always ON, whereby deterioration of the fourth transistor 804 and the fifth transistor 805 can be suppressed. That is, an image of a display device is not defected, so that performance and reliability of the display device can be increased.

Modification Example

In Embodiment 4, an example of the flip flop circuit formed using the five transistors 801 to 805 and the control circuit 800 and the transfer signal generation circuit formed using the four transistors 806 to 809 are described. However, an embodiment is not limited to such a structure.

For example, both the k-th flip flop circuit ($F_k$) and the k-th transfer signal generation circuit ($T_k$) may have the same structure as the k-th flip flop circuit ($F_k$) or the k-th transfer signal generation circuit ($T_k$) illustrated in FIG. 8. Further, the flip flop circuit and the transfer signal generation circuit can be formed by combination of the circuit in Embodiment 2 (FIG. 4) or Embodiment 3 (FIG. 6) and the circuit in Embodiment 4 (FIG. 8).

Furthermore, in Embodiment 4, the output signal of the k-th transfer signal generation circuit ($T_k$) and the output signal of the (k+2)th flip flop circuit ($F_{k+2}$) are applied to the stop pulse signal (STP($F_k$)) for the k-th flip flop circuit and the stop pulse signal (STP($T_k$)) for the k-th transfer signal generation circuit, respectively. However, a structure in Embodiment 4 is not limited to such a structure.

Embodiment 5

In Embodiment 5, a specific example of a transistor included in the flip flop circuit and the transfer signal generation circuit described in Embodiments 2 to 4 is described.

As the transistor, transistors which are formed using various materials and structures can be used. That is, there are no limitations on the type of transistors used. For example, a thin film transistor (TFT) including a non-single-crystal semiconductor film typified by a film made of amorphous silicon, polycrystalline silicon, microcrystalline (also referred to as microcrystal, nanocrystal, or semi-amorphous) silicon, or the like can be used.

The use of the thin film transistor for manufacturing a display device has various advantages. Since a thin film transistor can be formed at temperature lower than that at which a transistor using single crystal silicon is formed, reduction in manufacturing cost of a display device or increase in size of a manufacturing device can be realized. Further, since a thin film transistor can be manufactured at low temperature, the thin film transistor can be formed over a substrate with low heat resistance. Therefore, the transistor can be formed using a light-transmitting substrate with low heat resistance. In addition, since the thickness of the thin film transistor is thin, part of a film forming the transistor can transmit light. Accordingly, the aperture ratio can be increased.

In addition, a MOS transistor, a junction transistor, a bipolar transistor, or the like can be used as the transistor. Note that the size of a transistor can be reduced by the use of a MOS transistor as the transistor. Alternatively, the use of a bipolar transistor as the transistor allows a large amount of current to flow. Therefore, a high-speed operation is possible. Note that a MOS transistor and a bipolar transistor may be formed over one substrate. Thus, reduction in power consumption, reduction in size, a high-speed operation, and the like can be realized.

Note that by using a catalyst (e.g., nickel) for forming polycrystalline silicon, crystallinity can be further improved, and a thin film transistor having excellent electric characteristics can be formed. Accordingly, a gate driver circuit, a source driver circuit, and a signal processing circuit (e.g., a signal generation circuit, a gamma correction circuit, or a DA converter circuit) can be formed over the same substrate.

Further, by using a catalyst (e.g., nickel) for forming microcrystalline silicon, crystallinity can be further improved, and a transistor having excellent electric characteristics can be formed. At this time, crystallinity can be improved by just performing heat treatment without performing laser light irradiation. As a result, a gate driver circuit and part of a source driver circuit (e.g., an analog switch) can be formed over the same substrate. Note that in the case where laser irradiation for crystallization is not performed, unevenness in crystallinity of silicon can be suppressed. Thus, an image with improved image quality can be displayed.

Note that polycrystalline silicon or microcrystalline silicon can be formed without use of a catalyst (e.g., nickel).

Further, it is preferable that the entire silicon be improved in crystallinity but Embodiment 5 is not limited thereto. Only part of silicon may be improved in crystallinity. Selective increase in crystallinity can be achieved by selective laser irradiation or the like. For example, a region of a gate driver, a source driver, or the like may be irradiated with laser light. As a result, crystallinity of silicon can be improved only in a region in which a circuit needs to operate at high speed. Since a pixel portion does not need to be driven at high speed, a pixel circuit can be driven without a serious problem even when crystallinity is not improved; thus, a region where the crystallinity is improved is reduced and manufacturing process becomes shorter. Therefore, throughput is improved, so that manufacturing cost of a display device can be reduced.

In addition, the transistor is not limited to a transistor formed using silicon. As the transistor, a transistor formed using a compound semiconductor such as silicon germanium and gallium arsenide, or an oxide semiconductor such as zinc oxide and zinc oxide including indium and gallium can be employed. Further, a thin film transistor including a thin film formed of such a compound semiconductors or oxide semiconductor can be employed. Since the thin film transistor can be manufactured at low temperature, a transistor can be formed at room temperature, for example. Accordingly, the transistor can be formed directly on a substrate with low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Since such an element can be deposited or formed at the same time as the transistor, manufacturing cost of a display device can be reduced.

Further, a transistor including an organic semiconductor or a carbon nanotube can be used as the transistor. Accordingly, transistors can be formed over a substrate which can be bent. A display device using such a substrate can resist shock.

In addition, a manufacturing method of the transistor is not limited. As the manufacturing method, a photolithography method, an inkjet method, a printing method, or the like can be employed. Note that, since a mask (reticle) is not used during manufacture in an inkjet method and a printing method, a layout of a transistor can be changed with ease. Furthermore, since the transistor can be formed without use of a resist, material cost is reduced and the number of steps can be reduced. In addition, since a film can be formed where needed, a material is not wasted. Therefore, cost can be reduced.

Alternatively, as the transistor, a multi-gate transistor having two or more gate terminals can be used. With the multi-gate structure, a structure where a plurality of transistors are connected in series is obtained because channel regions are connected in series. Therefore, with the multi-gate structure, off-current of a transistor is reduced and the withstand voltage of the transistor can be increased (the reliability can be improved).

As the transistor, a transistor with a structure where gate terminals are formed above and below a channel region can also be used. By providing gate terminals above and below a channel region, a structure where a plurality of transistors are connected in parallel is obtained. That is, the channel region is increased. Thus, the amount of current can be increased. Further, by employing the structure where gate terminals are formed above and below the channel region, a depletion layer is easily formed; thus, an S value can be improved.

In addition, a transistor with the following structure can be used as the transistor: a structure where a gate terminal is formed above a channel region, a structure where a gate terminal is formed below a channel region, a forward staggered structure, an inverted staggered structure, a structure where a channel region is divided into a plurality of regions, a structure where channel regions are connected in parallel or in series, or the like.

Further alternatively, as the transistor, a transistor with a structure where a source terminal or a drain terminal overlaps with a channel region (or part of it) can be used. When the structure where the source terminal or the drain terminal overlaps with the channel region (or part of it) is used, electric charges can be prevented from being accumulated in part of the channel region, which would result in an unstable operation.

Furthermore, a structure in which an LDD region is provided can be applied to the transistor. By providing the LDD region, off-current of a transistor is reduced and the withstand voltage of the transistor can be increased (the reliability can be improved). In addition, by providing the LDD region, drain-source current is not changed very much even when drain-source voltage is changed when the transistor operates in the saturation region, so that a flat slope of voltage-current characteristics can be obtained.

Note that the transistor can be formed using various substrates. That is, the type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film are an attachment film formed using polypropylene, polyester, vinyl, polyvinyl fluoride, polyvinyl chloride, and the like. Examples of a base film are a base film formed using polyester, polyamide, polyimide, inorganic vapor deposition film, paper, and the like. In particular, when a transistor is formed using a semiconductor substrate, a single crystal substrate, an SOI substrate, or the like, a transistor with few variations in characteristics, size, shape, or the like, high current supply capability, and a small size can be formed. By forming a circuit using such transistors, power consumption of the circuit can be reduced or the circuit can be highly integrated.

Alternatively, the transistor may be formed using one substrate, and then, the transistor may be transferred to and provided over another substrate. Example of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, transistors with excellent properties or transistors with low power consumption and a device with high durability, high heat resistance, light weight, or thin thickness can be formed.

Embodiment 6

In Embodiment 6, examples of electronic devices including the display device described in Embodiment 1 are described with reference to FIGS. 11A to 11F, FIGS. 12A to 12D, and FIGS. 13A to 13D.

FIGS. 11A to 11F and FIGS. 12A to 12D illustrate electronic devices including the display device described in Embodiment 1. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, visible light, liquid, magnetism, temperature, chemical substance, sound, time, hardness, electric field, current, voltage, electric power, radiation, flow rate, humidity, gradient, oscillation, odor, or infrared ray), a microphone 5008, and the like. In these electronic devices, the display device described in Embodiment 1 is incorporated in the display portion 5001.

Figure 11A:
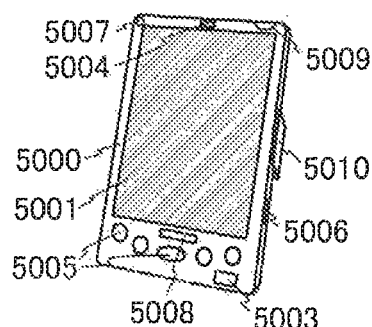
FIGS. 11A to 11F each illustrate a specific example of an electronic device described in Embodiment 6.
Figure 11B:
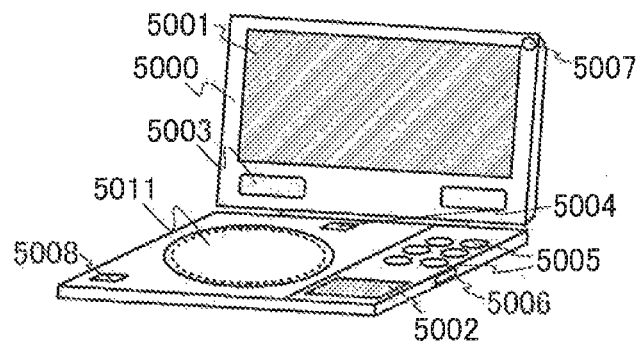
Figure 11C:
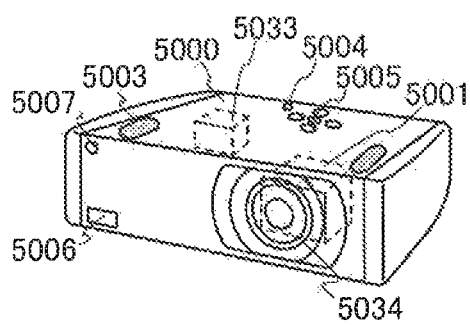
Figure 11D:
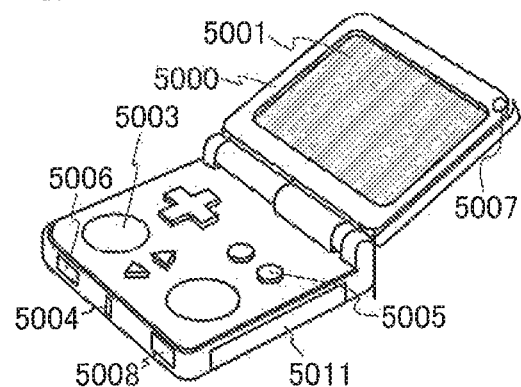
Figure 11E:
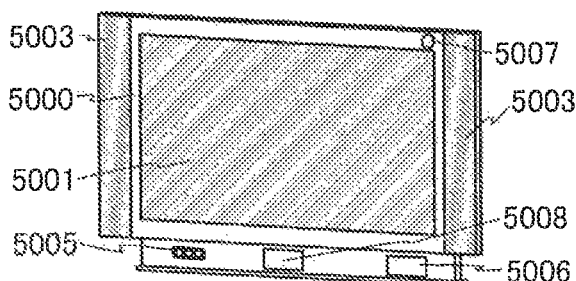
Figure 11F:
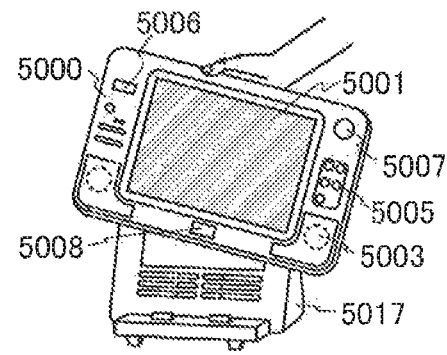
Figure 12A:
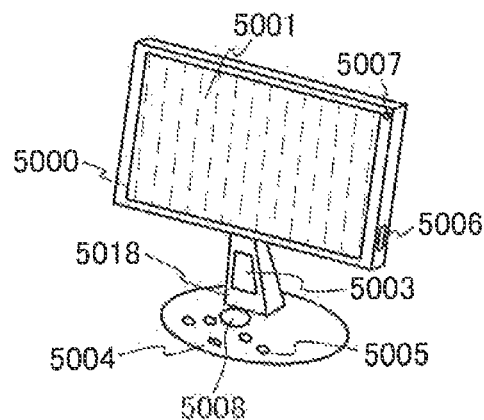
FIGS. 12A to 12D each illustrate a specific example of an electronic device described in Embodiment 6.
Figure 12B:
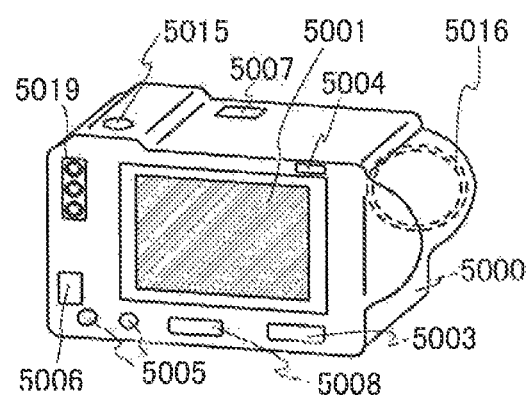
Figure 12C:
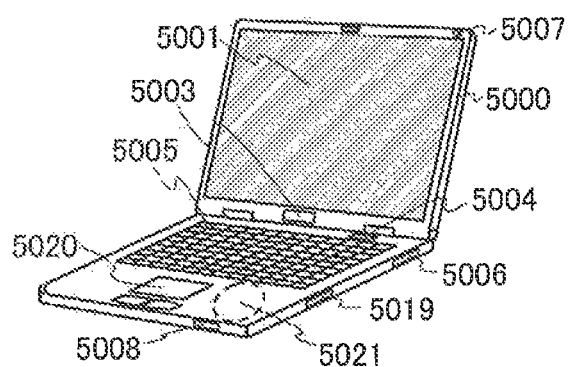
Figure 12D:
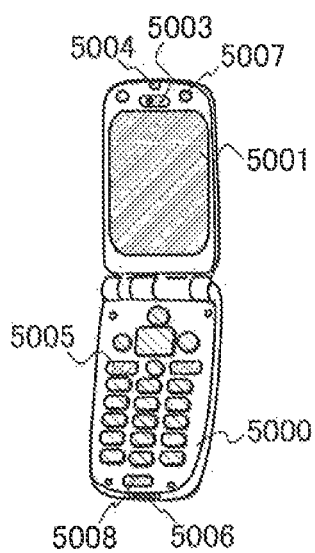

FIG. 11A illustrates a mobile computer, which can include a switch 5009, an infrared port 5010, and the like in addition to the above objects. FIG. 11B illustrates a portable image regenerating device provided with a memory medium (e.g., a DVD regenerating device), which can include a second display portion 5002, a memory medium reading portion 5011, and the like in addition to the above objects. FIG. 11C illustrates a projector, which can include a light source 5033, a projection lens 5034, and the like in addition to the above objects. FIG. 11D illustrates a portable game machine, which can include the memory medium reading portion 5011 and the like in addition to the above objects. FIG. 11E illustrates a television receiver, which can include a tuner, an image processing portion, and the like in addition to the above objects. FIG. 11F illustrates a portable television receiver, which can include a charger 5017 capable of transmitting and receiving signals and the like in addition to the above objects. FIG. 12A illustrates a display, which can include a support base 5018 and the like in addition to the above objects. FIG. 12B illustrates a camera, which can include an external connecting port 5019, a shutter button 5015, an image receiving portion 5016, and the like in addition to the above objects. FIG. 12C illustrates a computer, which can include a pointing device 5020, the external connecting port 5019, a reader/writer 5021, and the like in addition to the above objects. FIG. 12D illustrates a mobile phone, which can include an antenna, a tuner of one-segment (Iseg digital TV broadcasts) partial reception service for mobile phones and mobile terminals, and the like in addition to the above objects.

The electronic devices illustrated in FIGS. 11A to 11F and FIGS. 12A to 12D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; and a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 11A to 11F and FIGS. 12A to 12D are not limited thereto, and the electronic devices can have a variety of functions.

An example of the electronic devices incorporated in a building is described with reference to FIGS. 13A and 13B.

Figure 13A:
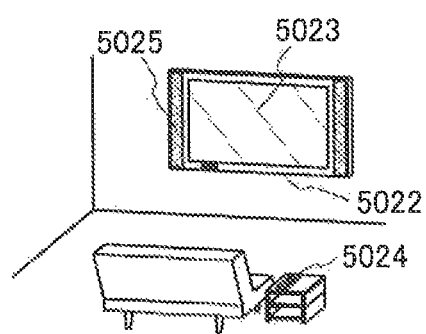
FIGS. 13A to 13D each illustrate a specific example of an electronic device described in Embodiment 6.

FIG. 13A illustrates an example of an electronic device incorporated in a building. The electronic device includes a housing 5022, a display portion 5023, a speaker 5025, and the like.

The electronic device can be operated with a remote controller 5024. The electronic device is incorporated in the building as a wall-hanging type and can be provided without requiring a large space.

Figure 13B:
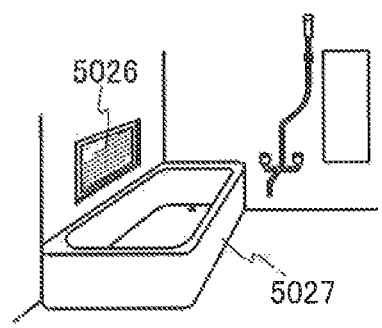

FIG. 13B illustrates an example of an electronic device incorporated in a building. The electronic device includes a display portion 5026 and is provided near a bathtub 5027, so that a person in the bathtub can view the display portion 5026.

Note that although in Embodiment 6, the wall and the bathtub are given as examples of the building, Embodiment 6 is not limited to them. The display panel can be provided in a variety of building.

Next, examples in which an electronic device is incorporated in a moving object are described with reference to FIGS. 13C and 13D.

Figure 13C:
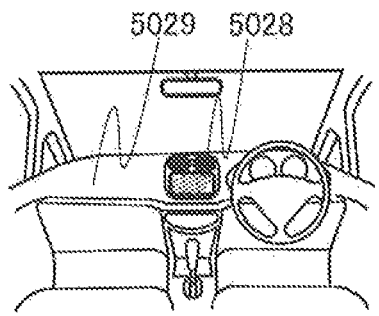

FIG. 13C illustrates an example in which an electronic device incorporated in a car. The electronic device includes a display portion 5028 is incorporated in a car body 5029. The electronic device can display information related to the operation of the car or information inputted from inside or outside of the car on demand. Note that the electronic device may have a navigation function.

Figure 13D:
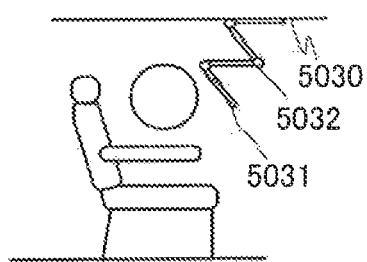

FIG. 13D illustrates an example of an electronic device provided in a passenger airplane. More specifically, FIG. 13D illustrates an application of the electronic device which is provided on a ceiling 5030 above a seat of the passenger airplane. The electronic device is incorporated in the ceiling 5030 with a hinge portion 5032, and a passenger can view the display portion 5031 by stretching of the hinge portion 5032. The electronic device has a function of displaying information by the operation of the passenger.

Note that although bodies of a car and an airplane are described as examples of moving objects in Embodiment 6, Embodiment 6 is not limited to them. The electronic devices can be provided for a variety of objects such as two-wheeled vehicles, four-wheeled vehicles (including cars, buses, and the like), trains (including monorails, railroads, and the like), and vessels.

The electronic devices described in this embodiment are characterized by having a display portion for displaying some sort of information and by having the display device described in Embodiment 1 incorporated in the display portion.

Example 1

In Example 1, suppression effect of a distorted or delayed signal in a gate driver including a transfer signal generation circuit is verified with a circuit simulation by comparison with a conventional example.

Figure 14A:
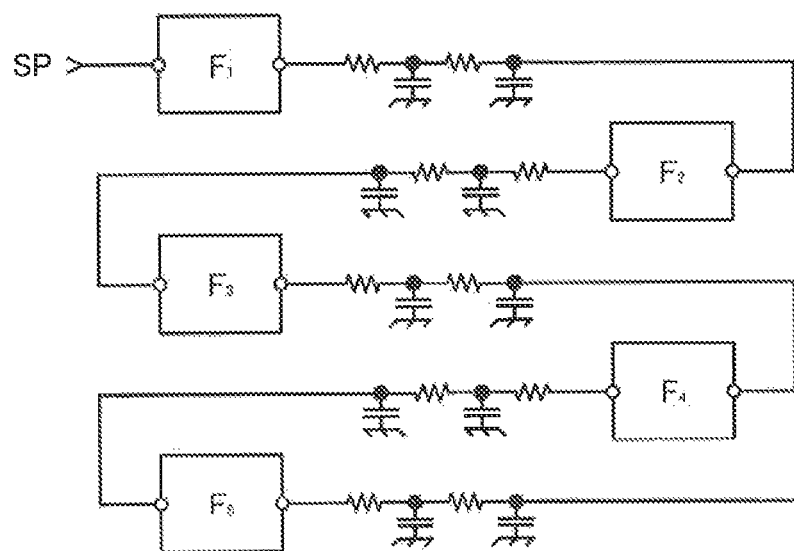
FIG. 14A illustrates a conventional circuit structure and FIG. 14B illustrates a circuit structure of this specification described in Example 1.
Figure 14B:
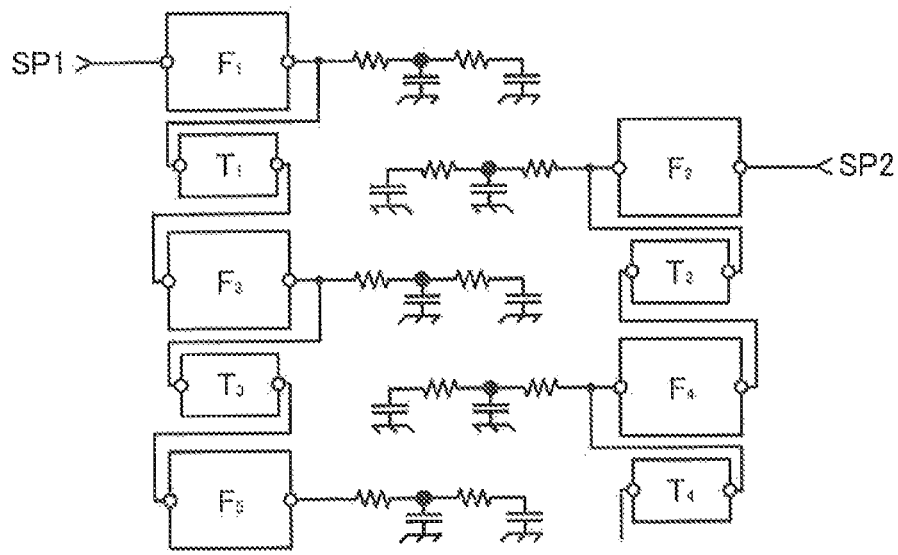

FIGS. 14A and 14B respectively illustrate circuit simulation models of a conventional gate driver and a gate driver in this specification. FIG. 14A illustrates a structure of the conventional gate driver in which an output signal of each flip flop circuit is used as a start pulse signal of the next flip flop circuit. FIG. 14B illustrates a structure of the gate driver in this specification in which a transfer signal generation circuit is provided between flip flop circuits.

In Example 1, output signals of the flip flop circuits in the case where the circuit illustrated in FIG. 4 was used as the flip flop circuits and the transfer signal generation circuit were calculated by a circuit simulation. Note that calculation software which was used was PSpice. Further, it is assumed that the threshold voltage of the transistor included in a flip flop circuit and a transfer signal generation circuit was 8 V and the field effect mobility thereof was 0.5 cm$^2$/Vs. In addition, it is assumed that a parasitic capacitance of 100 pF was formed in each gate line. Further, it is assumed that the voltage amplitude of a clock signal was 30 V (a potential of an H level was 30 V and a potential of an L level was 0 V), a ground voltage was 0 V, and a clock frequency was 41.7 kHz (a period was 24 µs).

Figure 15:
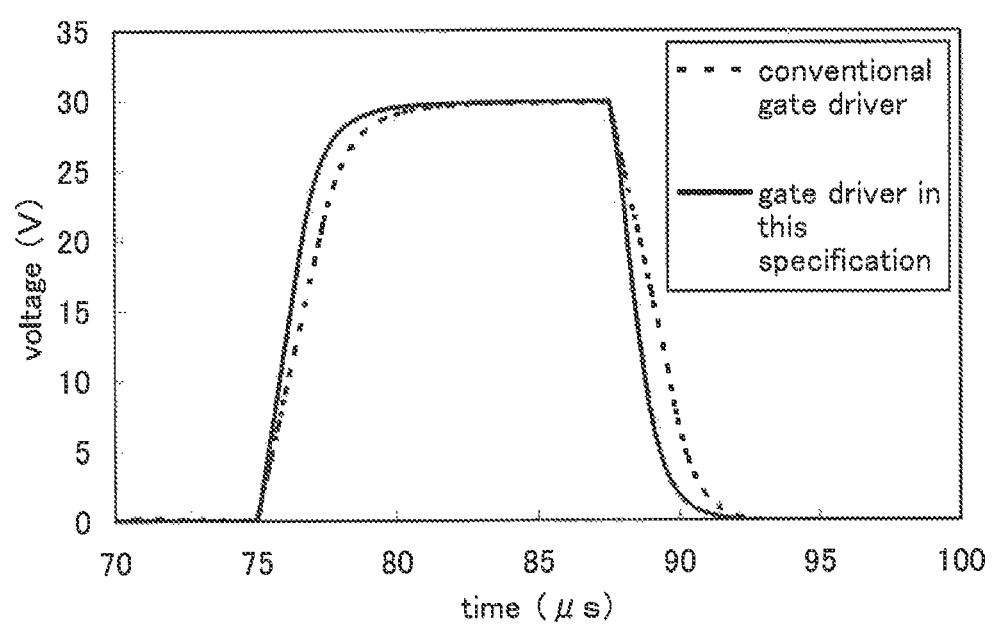
FIG. 15 illustrates an output signal of a flip flop circuit of a conventional gate driver and an output signal of a flip flop circuit of a gate driver disclosed in this specification which are described in Example 1.

FIG. 15 illustrates the output signal of the flip flop circuits calculated by a circuit simulation. As FIG. 15 illustrates, it was confirmed that delayed and distorted signals are reduced in the gate driver in this specification.

This application is based on Japanese Patent Application serial no. 2009-150617 filed with Japan Patent Office on Jun. 25, 2009, the entire contents of which are hereby incorporated by reference.

The invention claimed is:

1. A display device comprising:
a pixel portion comprising a plurality of gate lines; and
a first gate driver adjacent to the pixel portion, the first gate driver comprising:
a first circuit comprising a first transistor, a second transistor, a third transistor, and a fourth transistor; and
a second circuit comprising a fifth transistor, a sixth transistor, a seventh transistor, and an eighth transistor, wherein:
one of a source and a drain of the first transistor is directly connected to a first wiring;
the other of the source and the drain of the first transistor is directly connected to a second wiring configured to be supplied with a first clock signal;
one of a source and a drain of the second transistor is directly connected to the first wiring;
the other of the source and the drain of the second transistor is directly connected to a third wiring;
one of a source and a drain of the third transistor is directly connected to a gate of the first transistor;
the other of the source and the drain of the third transistor is directly connected to a fourth wiring;
a gate of the third transistor is directly connected to the fourth wiring;
one of a source and a drain of the fourth transistor is directly connected to the gate of the first transistor;
a gate of the fourth transistor is directly connected to a fifth wiring;
one of a source and a drain of the fifth transistor is directly connected to the fifth wiring;
the other of the source and the drain of the fifth transistor is directly connected to a sixth wiring configured to be supplied with a second clock signal;
one of a source and a drain of the sixth transistor is directly connected to the fifth wiring;
the other of the source and the drain of the sixth transistor is directly connected to the third wiring;
a gate of the sixth transistor is directly connected to a seventh wiring;
one of a source and a drain of the seventh transistor is directly connected to a gate of the fifth transistor;
the other of the source and the drain of the seventh transistor is directly connected to the first wiring;
a gate of the seventh transistor is directly connected to the first wiring;
one of a source and a drain of the eighth transistor is directly connected to the gate of the fifth transistor;
the other of the source and the drain of the eighth transistor is directly connected to the third wiring;
a gate of the eighth transistor is directly connected to the seventh wiring; and a ratio of a channel width to a channel length of the fourth transistor is larger than a ratio of a channel width to a channel length of the eighth transistor.

2. The display device according to claim 1, wherein the first circuit is configured to output a signal to at least one of the plurality of gate lines and the second circuit is configured not to output a signal to any of the plurality of gate lines.

3. The display device according to claim 1,
wherein the second circuit is configured to output a first stop pulse signal to the gate of the fourth transistor through the fifth wiring, and
wherein the seventh wiring is configured to be supplied with a second stop pulse signal.

4. A display device comprising:
a pixel portion comprising a plurality of gate lines; and
a first gate driver adjacent to the pixel portion, the first gate driver comprising:
  a first circuit comprising a first transistor, a second transistor, a third transistor, a fourth transistor, a fifth transistor, a sixth transistor, and a seventh transistor; and
  a second circuit comprising a eighth transistor, an ninth transistor, and a tenth transistor,
wherein:
one of a source and a drain of the first transistor is directly connected to a first wiring;
the other of the source and the drain of the first transistor is directly connected to a second wiring configured to be supplied with a first clock signal;
one of a source and a drain of the second transistor is directly connected to the first wiring;
the other of the source and the drain of the second transistor is directly connected to a third wiring;
one of a source and a drain of the third transistor is directly connected to a gate of the first transistor;
the other of the source and the drain of the third transistor is directly connected to a fourth wiring;
a gate of the third transistor is directly connected to the fourth wiring;
one of a source and a drain of the fourth transistor is directly connected to the gate of the first transistor;
the other of the source and the drain of the fourth transistor is directly connected to the third wiring;
one of a source and a drain of the fifth transistor is directly connected to the gate of the first transistor;
a gate of the fifth transistor is directly connected to a fifth wiring;

one of a source and a drain of the sixth transistor is directly connected to a gate of the second transistor and a gate of the fourth transistor;
the other of the source and the drain of the sixth transistor is directly connected to a sixth wiring;
a gate of the sixth transistor is directly connected to the sixth wiring;
one of a source and a drain of the seventh transistor is directly connected to the gate of the second transistor and the gate of the fourth transistor;
the other of the source and the drain of the seventh transistor is directly connected to the third wiring;
a gate of the seventh transistor is directly connected to the gate of the first transistor;
one of a source and a drain of the eighth transistor is directly connected to the fifth wiring;
the other of the source and the drain of the eighth transistor is directly connected to a seventh wiring configured to be supplied with a second clock signal;
one of a source and a drain of the ninth transistor is directly connected to a gate of the eighth transistor;
the other of the source and the drain of the ninth transistor is directly connected to the first wiring;
a gate of the ninth transistor is directly connected to the first wiring;
one of a source and a drain of the tenth transistor is directly connected to the gate of the eighth transistor;
the other of the source and the drain of the tenth transistor is directly connected to the third wiring;
a gate of the tenth transistor is directly connected to an eighth wiring; and
a ratio of a channel width to a channel length of the fifth transistor is larger than a ratio of a channel width to a channel length of the tenth transistor.

5. The display device according to claim 4, wherein the first circuit is configured to output a signal to at least one of the plurality of gate lines and the second circuit is configured not to output a signal to any of the plurality of gate lines.

6. The display device according to claim 4,
wherein the second circuit is configured to output a first stop pulse signal to the gate of the fifth transistor through the fifth wiring, and
wherein the eighth wiring is configured to be supplied with a second stop pulse signal.

* * * * *